(12) United States Patent
Kinoshita et al.

(10) Patent No.: US 10,510,656 B2
(45) Date of Patent: Dec. 17, 2019

(54) SEMICONDUCTOR DEVICE

(71) Applicant: Panasonic Intellectual Property Management Co., Ltd., Osaka (JP)

(72) Inventors: Yusuke Kinoshita, Kyoto (JP); Satoshi Tamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/329,464

(22) PCT Filed: Jul. 1, 2015

(86) PCT No.: PCT/JP2015/003304
§ 371 (c)(1),
(2) Date: Jan. 26, 2017

(87) PCT Pub. No.: WO2016/017068
PCT Pub. Date: Feb. 4, 2016

(65) Prior Publication Data
US 2017/0221814 A1    Aug. 3, 2017

(30) Foreign Application Priority Data

Jul. 30, 2014 (JP) .................................. 2014-155377

(51) Int. Cl.
*H01L 23/522* (2006.01)
*H01L 21/768* (2006.01)
(Continued)

(52) U.S. Cl.
CPC .......... *H01L 23/5226* (2013.01); *H01L 23/13* (2013.01); *H01L 23/535* (2013.01);
(Continued)

(58) Field of Classification Search
CPC ... H01L 23/522; H01L 21/768; H01L 23/528; H01L 23/532
See application file for complete search history.

(56) References Cited

U.S. PATENT DOCUMENTS

2005/0189561 A1    9/2005 Kinzer et al.
2005/0189562 A1    9/2005 Kinzer et al.
(Continued)

FOREIGN PATENT DOCUMENTS

JP    2000-049169 A    2/2000
JP    2007-522677 A    8/2007
(Continued)

OTHER PUBLICATIONS

International Search Report issued in Application No. PCT/JP2015/003304 with English translation.
(Continued)

*Primary Examiner* — Joseph C. Nicely
*Assistant Examiner* — Lamont B Koo
(74) *Attorney, Agent, or Firm* — McDermott Will & Emery LLP

(57) ABSTRACT

A semiconductor device includes: a high-side transistor having a first gate electrode, first drain electrodes and first source electrodes; a low-side transistor having a second gate electrode, second drain electrodes and second source electrodes; a plurality of first drain pads that are disposed above the first drain electrodes and are electrically connected to the first drain electrodes; a plurality of first source pads that are disposed above the second source electrodes and are electrically connected to the second source electrodes; a plurality of first common interconnects that are disposed above the first source electrodes and above the second drain electrodes and are electrically connected to the first source electrodes and the second drain electrodes; and a plurality of second (Continued)

common interconnects that are connected to the first common interconnects, and extend in a direction that intersects with the first common interconnects.

12 Claims, 15 Drawing Sheets

(51) Int. Cl.
|  |  |
|---|---|
| *H01L 23/528* | (2006.01) |
| *H01L 23/532* | (2006.01) |
| *H01L 23/13* | (2006.01) |
| *H01L 23/535* | (2006.01) |
| *H01L 25/065* | (2006.01) |
| *H01L 27/088* | (2006.01) |

(52) U.S. Cl.
CPC ........ *H01L 25/0657* (2013.01); *H01L 27/088* (2013.01); *H01L 2225/06548* (2013.01)

(56) References Cited

U.S. PATENT DOCUMENTS

| 2012/0091986 A1 | 4/2012 | Takemae et al. |
| 2013/0176013 A1 | 7/2013 | Takemae et al. |
| 2014/0103537 A1 | 4/2014 | Kaibara |

FOREIGN PATENT DOCUMENTS

| JP | 2011-146490 A | 7/2011 |
| JP | 2012-084743 A | 4/2012 |
| WO | 2012/176399 A1 | 12/2012 |

OTHER PUBLICATIONS

Office Action issued in corresponding Japanese Patent Application No. 2016-537724, dated Feb. 19, 2019 (Japanese language only).

SEMICONDUCTOR DEVICE

RELATED APPLICATIONS

This application is the U.S. National Phase under 35 U.S.C. § 371 of International Application No. PCT/JP2015/003304, filed on Jul. 1, 2015, which in turn claims the benefit of Japanese Application No. 2014-155377, filed on Jul. 30, 2014, the disclosures of which are incorporated by reference herein.

TECHNICAL FIELD

The present invention relates to a semiconductor device that is used as a switching element in a power supply circuit or the like, and to a technique that is effective for reducing interconnect inductance.

BACKGROUND ART

A direct current/direct current (DC/DC) converter composed of a high-side switch and a low-side switch is well known as a power supply circuit. A half-bridge configuration in which two transistors, namely, a high-side transistor and a low-side transistor, are connected is used not only in a DC/DC converter but also in an audio class-D amplifier and the like, and research and development has been actively carried out to improve power conversion efficiency and miniaturize the circuit.

Patent Literature (PTL) 1 discloses a configuration in which two nitride semiconductors that are connected in a half-bridge configuration are formed on a common substrate. This configuration is advantageous in that the half-bridge configuration can be formed within a single package, and thus the circuit can be miniaturized.

Patent Literature 2 discloses, as a technique for miniaturization of power semiconductor elements, a so-called pad-on element structure in which electrode pads are formed above an active region. This technique does not require the pads to be formed on the sides of the device as in Patent Literature 1, and thus enables a small chip area.

Furthermore, flip-chip mounting is another technique that contributes to the miniaturization of circuits. Flip-chip mounting provides an advantage of a smaller footprint than interconnect bonding. Also, flip-chip mounting provides an advantage of reducing interconnect resistance and interconnect inductance because interconnects can be shortened as compared to using wires.

CITATION LIST

Patent Literature

PTL 1: Japanese Unexamined Patent Application Publication No. 2007-522677
PTL 2: WO 2012/176399

SUMMARY OF THE INVENTION

However, the present inventors have noticed that with the pad-on element structure, it can be difficult to reduce the interconnect inductance of interconnects for extraction of electric current from the pads.

The present invention has been made in view of the problems described above, and it is an object of the present invention to provide a nitride semiconductor device having a small interconnect inductance.

In order to solve the above problems, a semiconductor device according to the present disclosure includes: a substrate; a semiconductor layer disposed on the substrate; a first transistor including a first gate electrode, a plurality of first drain electrodes and a plurality of first source electrodes that are disposed above the semiconductor layer; a second transistor including a second gate electrode, a plurality of second drain electrodes and a plurality of second source electrodes that are disposed above the semiconductor layer; a plurality of first drain pads that are disposed above the plurality of first drain electrodes, are electrically connected to the first drain electrodes, and extend in a first direction; a plurality of first source pads that are disposed above the plurality of second source electrodes, are electrically connected to the plurality of second source electrodes, and extend in the first direction; a plurality of first common interconnects that are disposed above the plurality of first source electrodes and above the plurality of second drain electrodes, are electrically connected to the plurality of first source electrodes and the plurality of second drain electrodes, and extend in the first direction; and a plurality of second common interconnects that are connected to the plurality of first common interconnects, and extend in a second direction that intersects with the first direction.

With the semiconductor device according to the present disclosure, two transistors are formed on a common substrate, and a half-bridge is formed with a pad-on element structure by using first common interconnects, as a result of which the interconnects between the first transistor and the second transistor can be shortened, and it is possible not only to enable a small chip area, but also to reduce the interconnect resistance and the interconnect inductance. In addition, the first common interconnects are physically and electrically connected by second common interconnects, and thus even when the semiconductor device is flip-chip mounted, electric current can be extracted at a low resistance and a low inductance from each of the source of the second transistor and the switch node of the half-bridge. As a result, it is possible to implement a nitride semiconductor device having a small interconnect inductance.

Figure 1A:
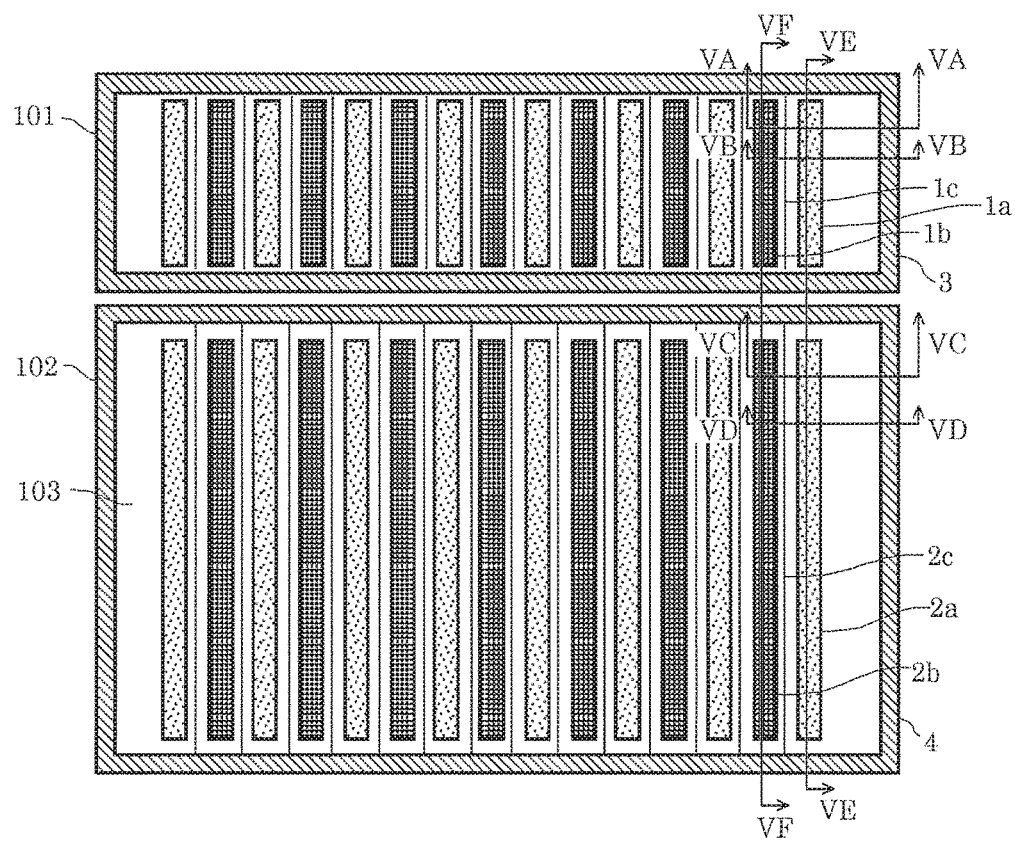
FIG. 1A is a plan view showing a layer in which transistors are formed in a nitride semiconductor device according to Embodiment 1.

DESCRIPTION OF EXEMPLARY EMBODIMENTS (Underlying Knowledge Forming Basis of the Present Invention)

Consideration will be given to an example in which a first transistor and a second transistor, which are two nitride semiconductor elements, in a half-bridge configuration are formed on a single substrate, and a pad-on element structure is produced. The source electrode of a high-side transistor serving as the first transistor and the drain electrode of a low-side transistor serving as the second transistor are connected with interconnects formed on the semiconductor elements, thereby forming a half-bridge configuration. A switch node pad that functions as an output pad for the half-bridge is provided by being connected to the interconnects.

With this configuration, it is possible to enable a small chip area and a small circuit area, as well as reduction in the interconnect resistance and the interconnect inductance between the high-side transistor and the low-side transistor.

Also, with the pad-on element structure, it is effective to form a plurality of source pads and drain pads connected to interconnects formed on the source electrode and the drain electrode in order to shorten the practical interconnect length from the electrodes to the pads so as to reduce the interconnect resistance and the interconnect inductance. In the case of a configuration in which a plurality of switch nodes and a plurality of source pads of the low-side transistor are formed with the pad-on element structure in the half-bridge configuration, the switch node pads and the source pads are alternately arranged.

However, when this configuration is flip-chip mounted, a current extraction path from a switch node pad and a current extraction path from a source electrode pad intersect with each other on the mounting surface, and thus there may be some pads that cannot be connected to interconnects for extracting electric current. In this case, electric current may concentratedly flow into interconnects that are connected to other pads from which electric current can be extracted, increasing the interconnect resistance and the interconnect inductance, and in some cases causing a problem of fusing the interconnects.

In order to solve the problem described above, a semiconductor device according to one aspect of the disclosure includes: a substrate; a semiconductor layer disposed on the substrate; a first transistor including a first gate electrode, a plurality of first drain electrodes and a plurality of first source electrodes that are disposed above the semiconductor layer; a second transistor including a second gate electrode, a plurality of second drain electrodes and a plurality of second source electrodes that are disposed above the semiconductor layer; first drain pads that are disposed above the first drain electrodes, are electrically connected to the first drain electrodes, and extend in a first direction; a plurality of first source pads that are disposed above the second source electrodes, are electrically connected to the second source electrodes, and extend along the first direction; a plurality of first common interconnects, each of which is disposed above one of the first source electrodes and above one of the second drain electrodes, is electrically connected to the one of the first source electrodes and the one of the second drain electrodes, and extends in the first direction; and a plurality of second common interconnects that are connected to the plurality of first common interconnects, and extend in a second direction that intersects with the first direction.

With the semiconductor device described above, two transistors are formed on a common substrate, and a half-bridge is formed with a pad-on element structure by using first common interconnects, as a result of which the interconnects between the first transistor and the second transistor can be shortened, and it is possible not only to enable a small chip area, but also to reduce the interconnect resistance and the interconnect inductance. In addition, the first common interconnects are physically and electrically connected by second common interconnects, and thus even when the semiconductor device is flip-chip mounted, electric current can be extracted at a low resistance and a low inductance from each of the source of the second transistor and the switch node of the half-bridge.

In the semiconductor device, the plurality of first source pads may be each disposed between an adjacent pair of the plurality of second common interconnects. With this configuration, the average distance of paths extending from the second source electrodes to the first source pads is shortened, and it is therefore possible to reduce the interconnect resistance and the interconnect inductance of the source of the second transistor.

Furthermore, in this case, an insulating film may be formed that has openings that partially expose interconnects that are electrically connected to the first drain pads, the first source pads and the second common interconnects. With this configuration, electric current can be easily extracted from the first source pads that are separated and isolated by a plurality of first common interconnects and second common interconnects when flip-chip mounted. Conversely, in the case of a configuration in which such an insulating film is not formed, it means the same as all of the first common interconnects and the second common interconnects being open, and interference occurs in a direction of extraction of electric current of the isolated first source pads, which make it difficult to flip-chip mount the semiconductor device.

In the semiconductor device, the plurality of first common interconnects may include a first vertical interconnect, a second vertical interconnect and a third vertical interconnect, the plurality of second common interconnects may include a first horizontal interconnect, a second horizontal interconnect and a third horizontal interconnect, the first vertical interconnect and the second vertical interconnect may be connected by the first horizontal interconnect and the second horizontal interconnect, the second vertical interconnect and the third vertical interconnect may be connected by the third horizontal interconnect, and the third horizontal interconnect may be disposed in a position between the first horizontal interconnect and the second horizontal interconnect in the first direction as viewed in plan view.

As a result of the first common interconnects and the second common interconnects being disposed in a grid pattern as described above, the area of the second common interconnects can be increased, and thus the interconnect resistance and the interconnect inductance of interconnects extending to the current extraction outlet as the switch node can be reduced.

The first vertical interconnect, the second vertical interconnect and the third vertical interconnect may be disposed adjacent to each other, and the first horizontal interconnect, the second horizontal interconnect and the third horizontal interconnect may be disposed adjacent to each other.

With this configuration, as described above, the interconnect resistance and the interconnect inductance of interconnects extending to the current extraction outlet as the switch node can be reduced.

Also, first source pads may be formed between the first common interconnects and the second common interconnects that are disposed in a grid pattern, and an insulating film may be formed that has openings that partially expose interconnects that are electrically connected to the first drain pads, the first source pads and the second common interconnects.

With this configuration, by flip-chip mounting, electric current can be easily extracted from the first source pads that are separated and isolated by a plurality of second common interconnects. In addition, the average distance of paths extending from the second source electrodes to the first source pads is shortened, and it is therefore possible to reduce the interconnect resistance and the interconnect inductance of the source of the second transistor.

A plurality of second source interconnects and a plurality of second drain interconnects that extend in the second direction may be disposed above the second transistor and below the plurality of first common interconnects.

With this configuration, the interconnect length to the pads electrically connected to the second source electrodes and the second drain electrodes can be reduced, and the apparent number of interconnects can be increased, and it is therefore possible to reduce the interconnect resistance and the interconnect inductance.

The plurality of second common interconnects may cover a part of the plurality of second source interconnects and a part of the plurality of second drain interconnects.

With this configuration, the area of the second common interconnects can be increased, and thus the interconnect resistance and the interconnect inductance of interconnects extending to the current extraction outlet as the switch node can be reduced. At this time, with the configuration in which the first source interconnects are covered with the second common interconnect, the path length to the first source pads may become longer than that of a configuration in which the first source interconnects are not covered with the second common interconnect, but when there are first source pads between the first common interconnects and the second common interconnects that are disposed in a grid pattern, electric current inescapably passes through the first source interconnects having a length as long as the length of the first horizontal interconnect, the second horizontal interconnect or the third horizontal interconnect, and can reach the first source pads, and thus an excessive increase in the interconnect resistance and the interconnect inductance can be suppressed.

In the semiconductor device, there may be only a single second common interconnect.

With this configuration, the area of the first source pads can be increased, and the interconnect resistance and the interconnect inductance of the second transistor can be reduced.

The single second common interconnect may be disposed above the plurality of first common interconnects.

With this configuration, although cost increases due to an additional interconnect step, the first source pads can be extended in the second direction without the first source pads being spatially interfered with the second common interconnects. Accordingly, the area of the first source pads can be increased, and the interconnect resistance and the interconnect inductance of the second transistor can be reduced.

The semiconductor device may further include a mounting circuit substrate, and the mounting circuit substrate may include: at least one first via hole opening; a plurality of first metal plane layers for flip-chip mounting that are electrically connected to the plurality of first common interconnects; and a third common interconnect that is electrically connected to the first metal plane layers via a via hole formed within the at least one first via hole opening.

With this configuration, without providing second common interconnects on the nitride semiconductor layer in the semiconductor device, the third common interconnect that is electrically connected to the first common interconnects can be provided in a different layer from the mounting surface of the circuit substrate on which the nitride semiconductor layer is flip-chip mounted. In this case, the first source pads layer is not spatially interfered with the second common interconnects, and thus the area of the first source pads can be increased, and the interconnect resistance and the interconnect inductance of the second transistor can be reduced.

A switch node metal plane layer aggregated by the third common interconnect may be provided either the mounting surface or the back surface of the circuit substrate.

In the case where this switch node is disposed on the mounting surface, a via hole that electrically connects a second drain pad and a fourth connection interconnect and a via hole that electrically connects the fourth connection interconnect and the switch node pad may be disposed as close as possible to each other. With this configuration, the directions of electric currents flowing through the two types of via holes are opposite, and thus magnetic fluxes generated by the currents can be cancelled out, and the inductance of the via holes can be reduced.

The semiconductor may further include a mounting circuit substrate, and the mounting circuit substrate may include: at least one second via hole opening; a plurality of second metal plane layers for flip-chip mounting that are electrically connected to the plurality of first source pads; and a fourth common interconnect that is electrically connected to the second metal plane layers via a via hole formed within the at least one second via hole opening.

With this configuration, without providing second common interconnects on the nitride semiconductor layer in the semiconductor device, the fourth common interconnect that is electrically connected to the first source pads can be provided in a different layer from the mounting surface of the circuit substrate on which the nitride semiconductor layer is flip-chip mounted, and the first drain pads and the switch node can be pulled out onto the mounting surface of the circuit substrate, and the first source pads can be aggregated and pulled out by the fourth common interconnect provided in a different layer from the mounting surface. In this case, because there are via holes in a loop of electric current flowing back to the power supply via the half-bridge, there is a high possibility of the occurrence of noise at the time of a switching operation due to the inductance of the via holes, but in the nitride semiconductor element itself, the interconnects between the first transistor and the second transistor can be shortened, and it is therefore possible not only to enable a small chip area but also to reduce the interconnect resistance and the interconnect inductance.

The semiconductor may further include a mounting circuit substrate, and the mounting circuit substrate may include: at least one third via hole opening; a plurality of third metal plane layers for flip-chip mounting that are electrically connected to the plurality of second drain source pads; and a fifth common interconnect that is electrically connected to the third metal plane layers via a via hole formed within the at least one third via hole opening.

With this configuration, without providing second common interconnects on the nitride semiconductor layer in the semiconductor device, the fifth common interconnect that is electrically connected to the first drain pads can be provided in a different layer from the mounting surface of the circuit substrate on which the nitride semiconductor layer is flip-chip mounted, and the switch node and the first source pads can be pulled out onto the mounting surface, and the first drain pads can be aggregated and pulled out by the fifth common interconnect provided in a different layer. In this case, because there are via holes in a loop of electric current flowing back to the power supply via the half-bridge, there is a high possibility of the occurrence of noise at the time of a switching operation due to the inductance of the via holes, but in the nitride semiconductor element itself, the interconnects between the first transistor and the second transistor can be shortened, and it is therefore possible not only to enable a small chip area but also to reduce the interconnect resistance and the interconnect inductance.

Hereinafter, embodiments will be described with reference to the drawings. The present disclosure is not limited to the embodiments given below. The drawings are schematic or conceptual representations, and thus the relationship between thickness and width of each structural element, the ratio of the size between structural elements and the like are not necessarily the same as those actually used. Structural elements that are substantially the same may be shown in different scales and ratios depending on the drawings. Also, structural elements that are substantially the same are given the same reference numerals, and a detailed description may be omitted as appropriate. Among the structural elements described in the following embodiments, structural elements not recited in any one of the independent claims are described as arbitrary structural elements.

The present disclosure also encompasses various embodiments obtained by making modifications that can be conceived by a person having ordinary skill in the art to each of the embodiments without departing from the scope of the present disclosure. Also, at least a part of a plurality of embodiments may be combined without departing from the scope of the present disclosure.

Embodiment 1

A nitride semiconductor device according to Embodiment 1 of the present disclosure will be described with reference to FIGS. 1A to 5F.

Figure 1B:
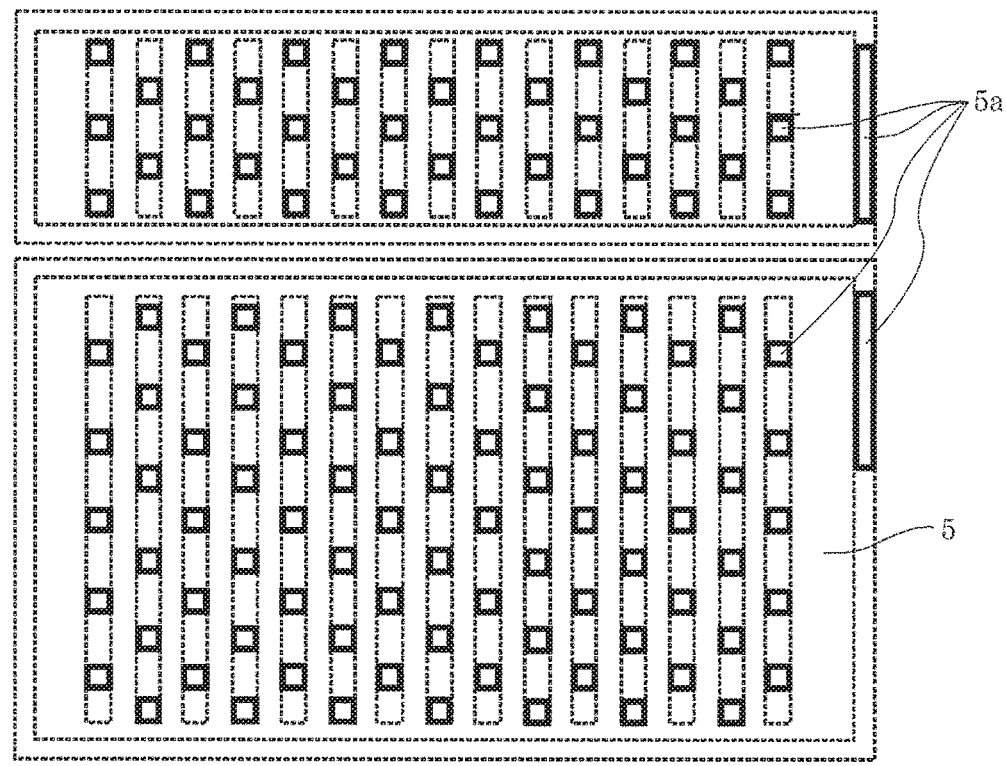
FIG. 1B is a plan view showing an upper layer overlying the layer shown in FIG. 1A.
Figure 2A:
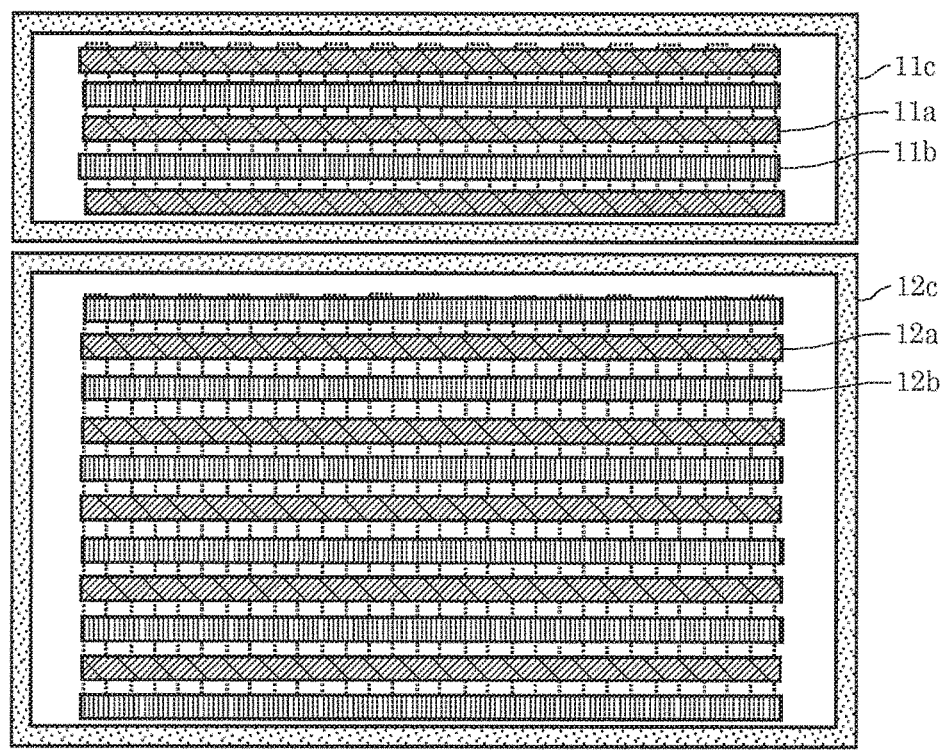
FIG. 2A is a plan view showing an upper layer overlying the layer shown in FIG. 1B.
Figure 2B:
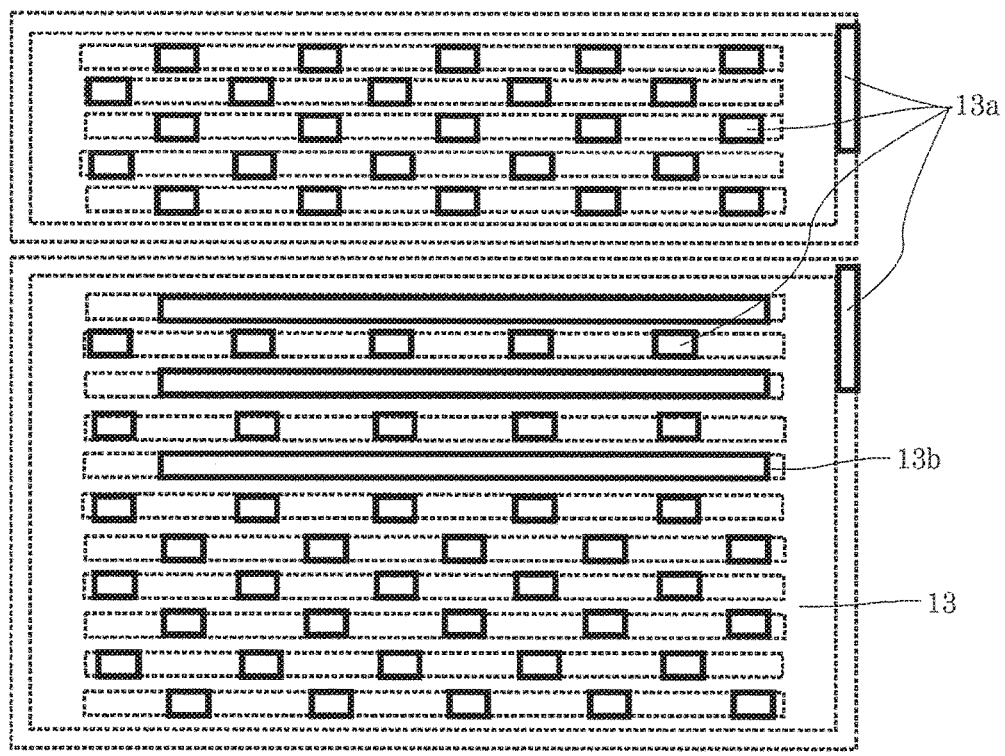
FIG. 2B is a plan view showing an upper layer overlying the layer shown in FIG. 2A.
Figure 3:
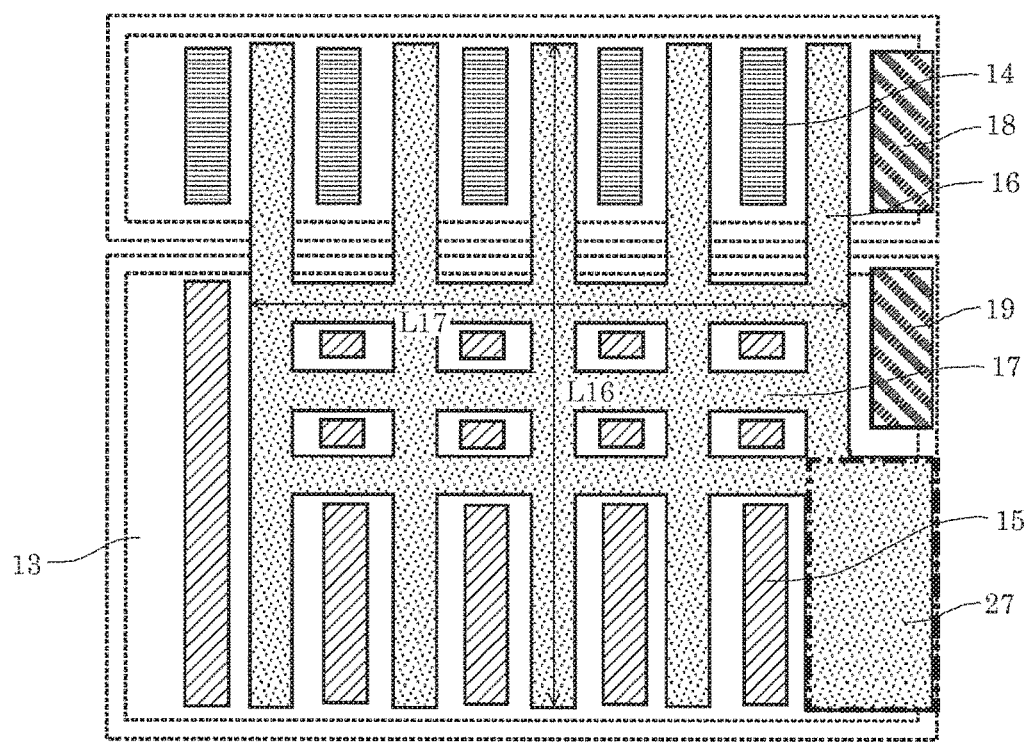
FIG. 3 is a plan view showing an upper layer overlying the layer shown in FIG. 2B.
Figure 4A:
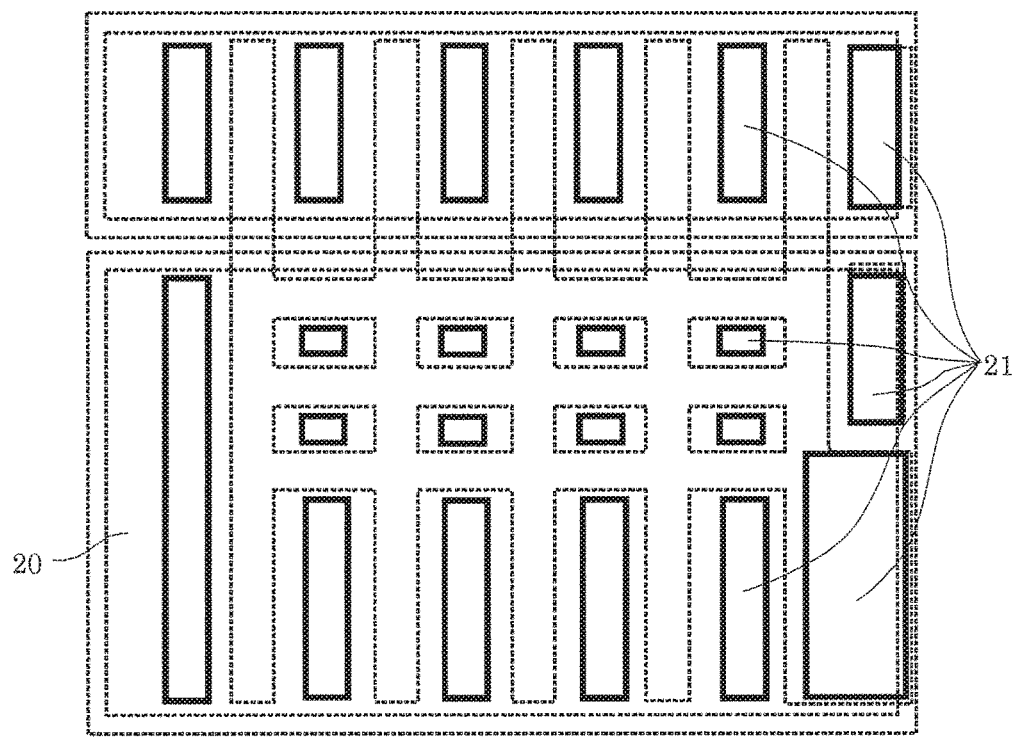
FIG. 4A is a plan view showing an upper layer overlying the layer shown in FIG. 3.

FIG. 1A is a plan view showing a layer in which a first transistor and a second transistor are formed in the nitride semiconductor device according to Embodiment 1 of the present disclosure. FIG. 1B is a plan view showing an upper layer overlying the layer shown in FIG. 1A. FIG. 2A is a plan view showing an upper layer overlying the layer shown in FIG. 1B. FIG. 2B is a plan view showing an upper layer overlying the layer shown in FIG. 2A. FIG. 3 is a plan view showing an upper layer overlying the layer shown in FIG. 2B. FIG. 4A is a plan view showing an upper layer overlying the layer shown in FIG. 3.

Figure 4B:
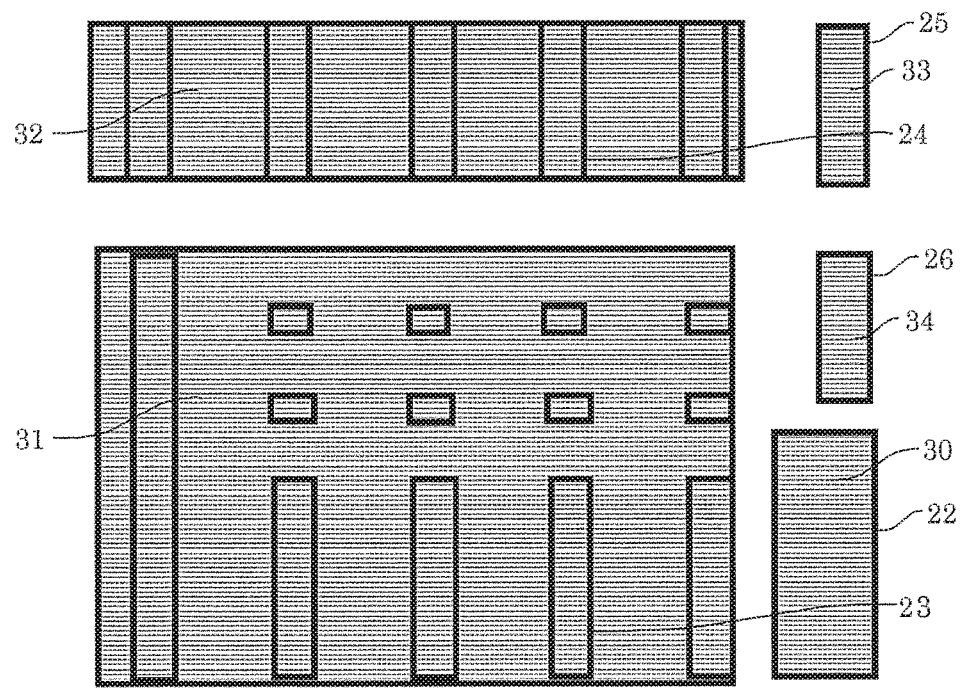
FIG. 4B is a plan view showing connecting portions connecting to a mounting circuit substrate on which the nitride semiconductor device according to the present embodiment is flip-chip mounted and metal plane layers on the mounting circuit substrate side.

FIG. 4B is a plan view showing connecting portions connecting to a mounting circuit substrate on which the nitride semiconductor device according to the present embodiment is flip-chip mounted and metal plane layers on the mounting circuit substrate side.

Figure 5A:
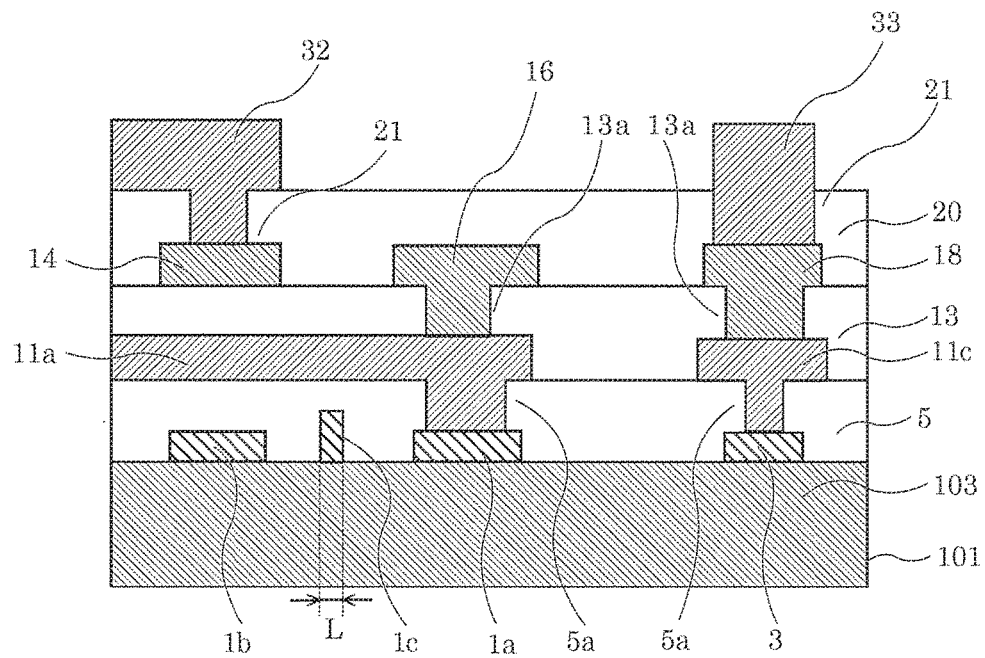
FIG. 5A is a cross-sectional view of the nitride semiconductor device according to Embodiment 1, taken along a vertical plane including the VA-VA line of the plan view shown in FIG. 1A.
Figure 5B:
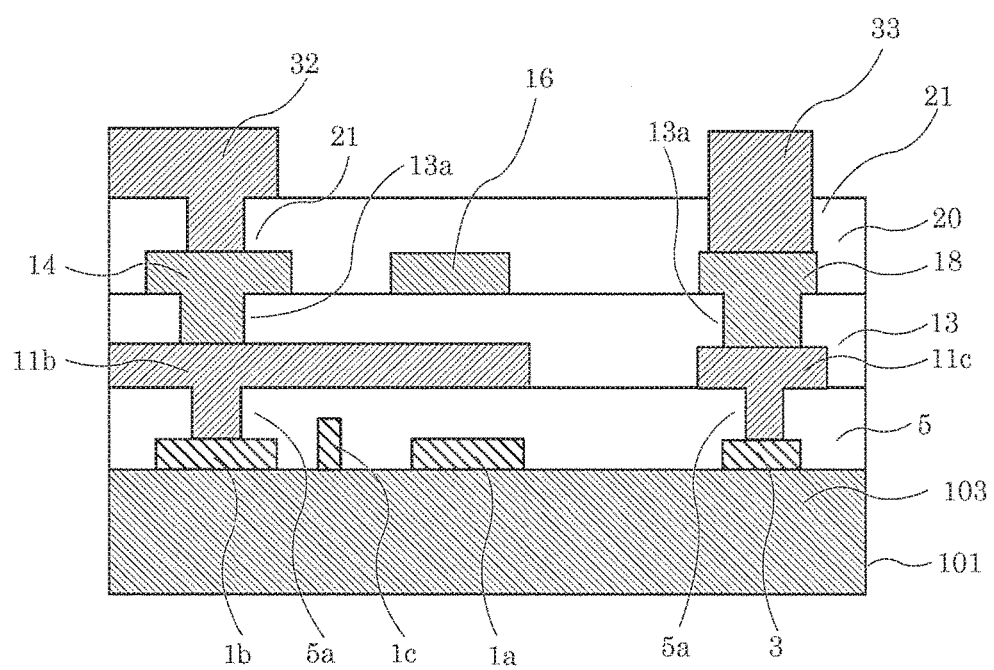
FIG. 5B is a cross-sectional view of the nitride semiconductor device according to Embodiment 1, taken along a vertical plane including the VB-VB line of the plan view shown in FIG. 1A.
Figure 5C:
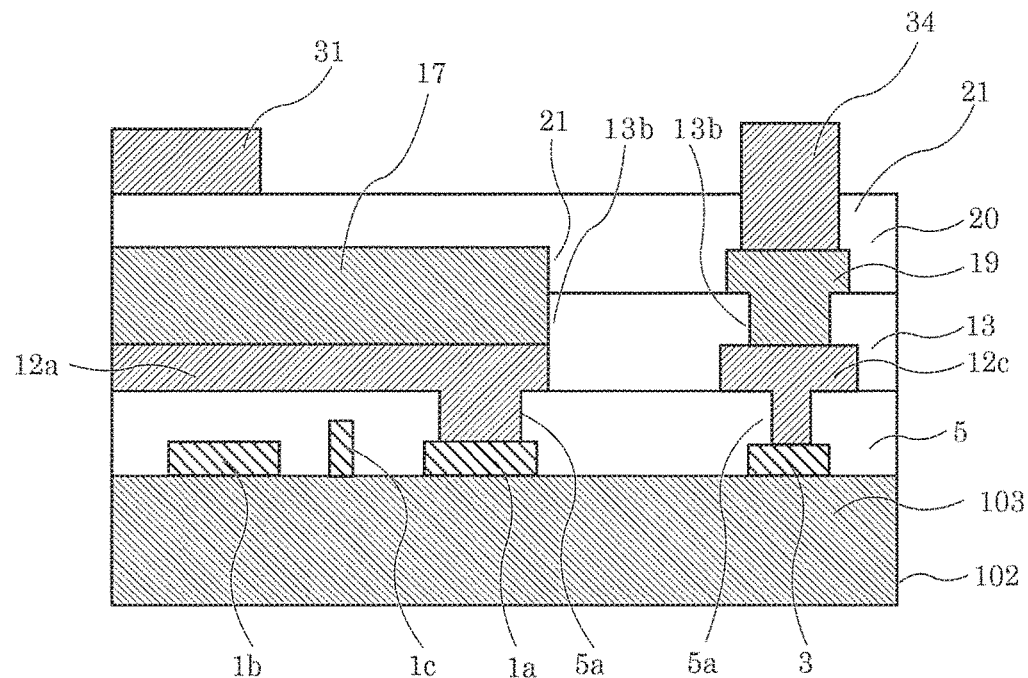
FIG. 5C is a cross-sectional view of the nitride semiconductor device according to Embodiment 1, taken along a vertical plane including the VC-VC line of the plan view shown in FIG. 1A.
Figure 5D:
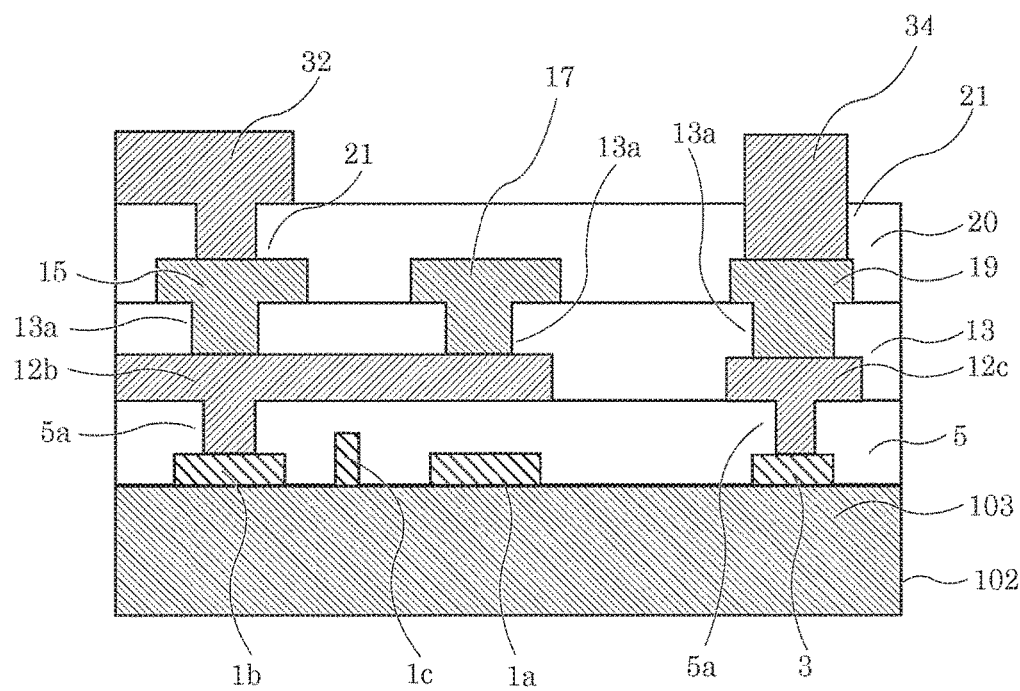
FIG. 5D is a cross-sectional view of the nitride semiconductor device according to Embodiment 1, taken along a vertical plane including the VD-VD line of the plan view shown in FIG. 1A.
Figure 5E:
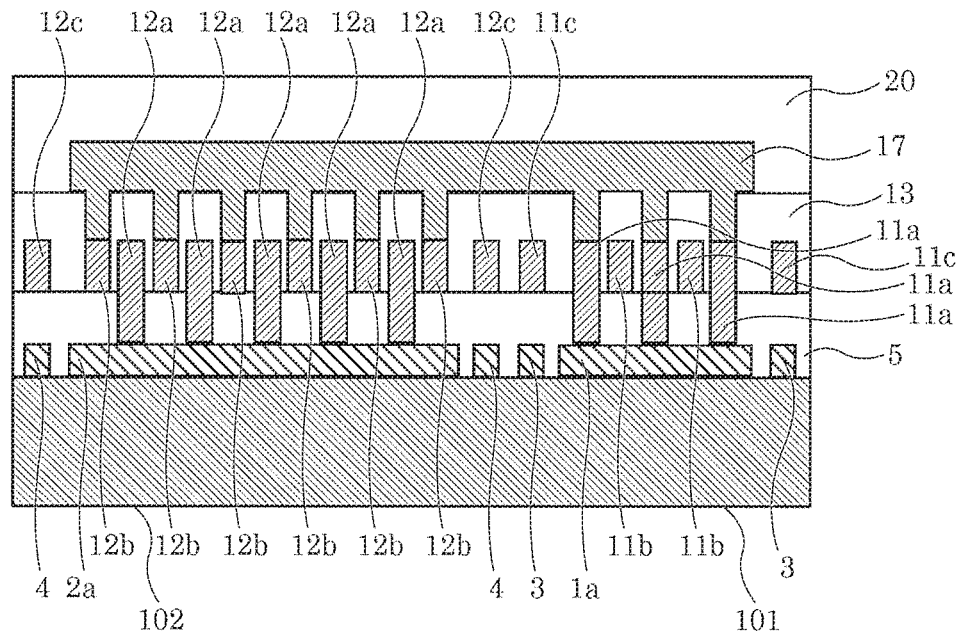
FIG. 5E is a cross-sectional view of the nitride semiconductor device according to Embodiment 1, taken along a vertical plane including the VE-VE line of the plan view shown in FIG. 1A.
Figure 5F:
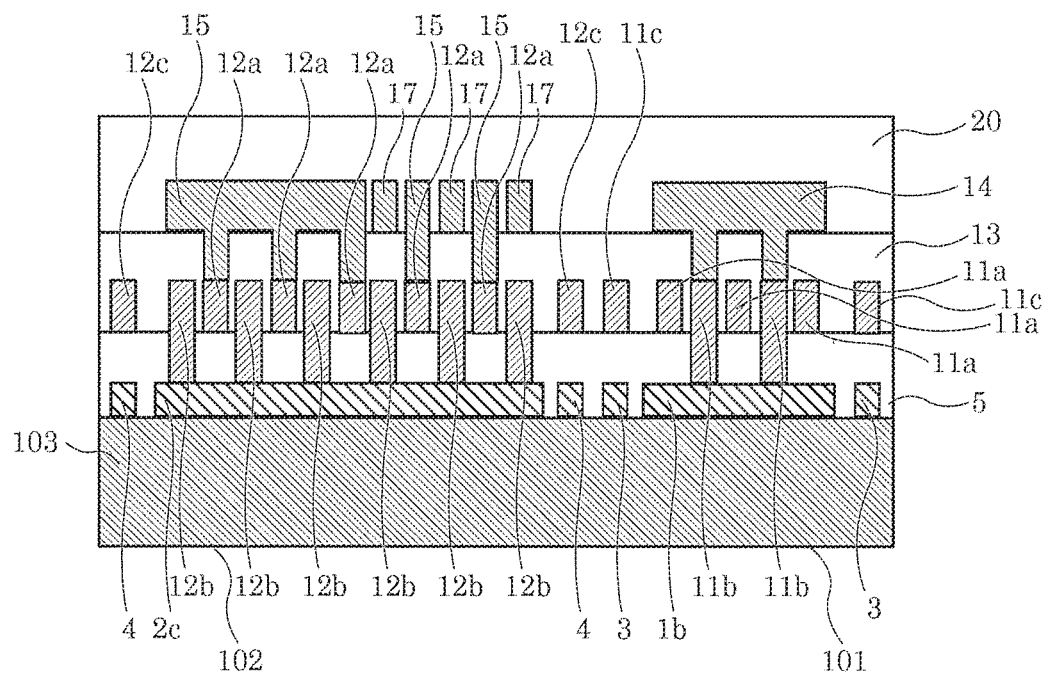
FIG. 5F is a cross-sectional view of the nitride semiconductor device according to Embodiment 1, taken along a vertical plane including the VF-VF line of the plan view shown in FIG. 1A.

FIGS. 5A to 5F are cross-sectional views of the nitride semiconductor device according to the present embodiment. FIG. 5A is a cross-sectional view taken along a vertical plane including the VA-VA line of the plan view shown in FIG. 1A. FIG. 5B is a cross-sectional view taken along a vertical plane including the VB-VB line of the plan view shown in FIG. 1A. FIG. 5C is a cross-sectional view taken along a vertical plane including the VC-VC line of the plan view shown in FIG. 1A. FIG. 5D is a cross-sectional view taken along a vertical plane including the VD-VD line of the plan view shown in FIG. 1A. FIG. 5E is a cross-sectional view taken along a vertical plane including the VE-VE line of the plan view shown in FIG. 1A. FIG. 5F is a cross-sectional view taken along a vertical plane including the VF-VF line of the plan view shown in FIG. 1A.

Hereinafter, the terms "vertical" and "horizontal" will be used. The term "vertical" refers to the up down direction on the sheets of FIGS. 1A to 4B, and the term "horizontal" refers to the right left direction on the sheets of FIGS. 1A to 4B.

As shown in FIG. 1A, high-side transistor 101 serving as a first transistor and low-side transistor 102 serving as a second transistor are transistors having a multi-finger structure.

The nitride semiconductor device according to the present embodiment has, for example, the following dimensions: a vertical length of 2000 µm and a horizontal length of 3000 µm. High-side transistor 101 has the following dimensions: a vertical length of 500 µm and a horizontal length of 3000 µm. Low-side transistor 102 has the following dimensions: a vertical length of 1500 µm and a horizontal length of 3000 µm. The reason that low-side transistor 102 has larger dimensions than those of high-side transistor 101 is to decrease the resistance value of the low-side transistor having a long energization time so as to reduce conduction loss on the assumption that the present invention is applied to a buck type DC/DC converter having a large buck ratio. The dimensions of the high-side transistor and the low-side transistor may be determined as appropriate.

Hereinafter, high-side transistor 101 will be described as an example. High-side transistor 101 is formed by forming first source electrodes 1a, first drain electrodes 1b and first gate electrode 1c that are formed on a semiconductor multi-layer structure that is formed on a Si substrate (not shown), the semiconductor multi-layer structure including nitride semiconductor layer 103. To be specific, the semiconductor multi-layer structure is a nitride semiconductor multi-layer structure, and the farthest layer from the Si substrate is nitride semiconductor layer 103 made of AlGaN with an Al composition ratio of 20%. First source electrodes 1a and first drain electrodes 1b, which are made of metals such as titanium (Ti) and aluminum (Al), are formed on nitride semiconductor layer 103, which is made of AlGaN with an Al composition ratio of 20%. First gate electrode 1c, which is made of palladium (Pd) or the like, is also formed on nitride semiconductor layer 103.

First gate electrode 1c has a gate length (length L in FIG. 5A) of 1 µm. Also, the interval between the center of first gate electrode 1c and the center of first source electrode 1a is 2 µm, and the interval between the center of first gate electrode 1c and the center of first drain electrode 1b is 2.5 µm.

From the right in FIG. 1A, a unit in which first source electrode 1a, first gate electrode 1c and first drain electrode 1b are arranged in this order and a unit in which first drain electrode 1b, first gate electrode 1c and first source electrode 1a are arranged in this order are repeatedly alternated while sharing either first source electrode 1a or first drain electrode 1b. A plurality of first source electrodes 1a, a plurality of first drain electrodes 1b and a plurality of first gate electrodes 1c are provided in an elongated shape parallel to each other.

First gate electrodes 1c have a longitudinal length of 420 µm. First source electrodes 1a have a longitudinal length of 400 µm, and first drain electrodes 1b have a longitudinal length of 400 µm.

First source electrode 1a and first drain electrode 1b included in each unit are electrically connected to each other by a structure described later. Also, first gate electrode 1c included in each unit is electrically connected to first gate electrode 1c in other units via first gate electrode interconnect 3. First gate electrode interconnect 3 has a width of 40 µm. First gate electrode interconnect 3 is provided to extend along a peripheral portion of high-side transistor 101 and surrounds a plurality of first source electrodes 1a, a plurality of first drain electrodes 1b and a plurality of first gate electrodes 1c.

With this configuration the plurality of units function as a single multi-finger structure transistor, and thus the gate width of the nitride semiconductor device can be increased to allow a large electric current to flow therethrough. As used herein, "gate width" refers to a value obtained by multiplying the longitudinal length of the gate electrode 1c included in one unit by the number of fingers.

In the present embodiment, in nitride semiconductor layer 103, a region in which a group of first source electrodes 1a and first drain electrodes 1b is formed, and a region that serves as a channel region and is not isolated are defined as active regions.

Up to here, high-side transistor 101 has been described as an example. The same applies to low-side transistor 102 by replacing first source electrodes 1a, first drain electrodes 1b and first gate electrodes 1c by second source electrodes 2a, second drain electrodes 2b and second gate electrodes 2c, respectively.

In low-side transistor 102, second gate electrodes 2c have a longitudinal length of 1420 µm. Second source electrodes 2a have a longitudinal length of 1400 µm, and second drain electrodes 1b have a longitudinal length of 1400 µm. Second gate electrode interconnect 4 has a width of 40 µm. Second gate electrode interconnect 4 is provided to extend along a peripheral portion of low-side transistor 102 and surrounds a plurality of second source electrodes 2a, a plurality of second drain electrodes 2b and a plurality of second gate electrodes 2c.

For the purpose of achieving a low resistance and the like, on each of the source electrode, the drain electrode and the gate electrode, a metal film that is made of nickel (Ni), gold (Au) or the like and has the same electrode width as the corresponding electrode may be overlaid and formed.

As shown in FIG. 1B, on the layers shown in FIG. 1A such as nitride semiconductor layer 103, a film that has a thickness of about 500 nm and is made of silicon nitride (SiN) and first insulating film 5 that has a thickness of about 1 µm and is made of polybenzo-oxazole (PBO) are formed. The SiN film functions as a moisture resistant film for protecting nitride semiconductor layer 103 and also functions as an adhesion layer to PBO.

In first insulating film 5, a plurality of openings 5a are formed that partially expose first source electrodes 1a, first drain electrodes 1b, first gate electrode interconnect 3, second source electrodes 2a, second drain electrodes 2b and second gate electrode interconnect 4, respectively.

Openings 5a of first insulating film 5 that expose first source electrodes 1a are formed in equivalent longitudinal positions in each first source electrode 1a. Likewise, openings 5a of first insulating film 5 that expose first drain electrodes 1b are formed in equivalent longitudinal positions in each first drain electrode 1b, the positions being different from those of openings 5a that expose first source electrodes 1a. That is, in the present embodiment, openings 5a that expose first source electrodes 1a and openings 5a that expose first drain electrodes 1b are formed in an offset manner to each other in the longitudinal direction of the electrodes.

Up to here, a portion regarding high-side transistor 101 has been described as an example, but the same applies to low-side transistor 102 by replacing first source electrodes 1a, first drain electrodes 1b, first gate electrodes 1c and first gate electrode interconnect 3 by second source electrodes 2a, second drain electrodes 2b, second gate electrodes 2c and second gate electrode interconnect 4, respectively.

As shown in FIG. 2A, on first insulating film 5, first source interconnects 11a electrically connected to first source electrodes 1a are formed via openings 5a. Also, on first insulating film 5, first drain interconnects 11b electrically connected to first drain electrodes 1b are formed via openings 5a. Also, on first insulating film 5, first gate interconnect 11c electrically connected to first gate electrode interconnect 3 is formed via openings 5a.

First source interconnects 11a and first drain interconnects 11b are formed in an elongated shape extending in a direction intersecting with first source electrodes 1a and first drain electrodes 1b. First source interconnects 11a and first drain interconnects 11b are alternately disposed and spaced apart from each other.

First source interconnects 11a, first drain interconnects 11b and first gate interconnect 11c are formed by sequentially stacking a lower adhesion layer that has a thickness of about 100 nm and is made of Ti, a conductive layer that has a thickness of about 5 µm and is made of copper (Cu), and an upper adhesion layer that has a thickness of about 100 nm and is made of Ni.

First source interconnects 11a have a length of 2900 µm and a width of 40 µm. First drain interconnects 11b have a length of 2900 µm and a width of 40 µm. The interval between the interconnect ends of adjacent first source interconnect 11a and first drain interconnect 11b is 15 µm.

Also, first gate interconnect 11c is provided to extend along the periphery of high-side transistor 101. First gate interconnect 11c has a width of 35 µm.

Up to here, a portion regarding high-side transistor 101 has been described as an example, but the same applies to low-side transistor 102 by replacing first source interconnects 11a, first drain interconnects 11b and first gate interconnect 11c by second source interconnects 12a, second drain interconnects 12b and second gate interconnect 12c, respectively.

Second source interconnects 12a have a length of 2800 µm and a width of 40 µm. Second drain interconnects 12b have a length of 2800 µm and a width of 40 µm. The interval between the interconnect ends of adjacent second source interconnect 12a and second drain interconnect 12b is 15 µm.

Also, second gate interconnect 12c is provided to extend along the periphery of low-side transistor 102. Second gate interconnect 12c has a width of 40 µm.

Openings 5a that expose first source electrodes 1a, openings 5a that expose first drain electrodes 1b, openings 5a that expose second source electrodes 2a and openings 5a that expose second drain electrodes 2b have a rectangular opening having long sides with a length of 35 µm and short sides with a length of 1.2 µm. Also, opening 5a that exposes first gate electrode interconnect 3 and opening 5a that exposes second gate electrode interconnect 4 have a rectangular opening having long sides with a length of 300 µm and short side with a length of 35 µm.

As shown in FIG. 2B, on the structural elements shown in FIG. 2A such as first source interconnects 11a, second insulating film 13 that has a thickness of about 10 µm and is made of PBO is formed. In second insulating film 13, a plurality of openings 13a are formed that partially expose first source interconnects 11a, first drain interconnects 11b, first gate interconnect 11c, second source interconnects 12a, second drain interconnects 12b and second gate interconnect 12c.

In addition, in second insulating film 13, a plurality of openings 13b are also formed that partially expose second drain interconnects 12b and are sized to be larger than openings 13a.

Openings 13a that expose first source interconnects 11a, openings 13a that expose first drain interconnects 11b and openings 13a that expose second source interconnects 12a have a rectangular opening having long sides with a length of 200 µm and short sides having a length of 35 µm. Also, opening 13a that exposes first gate interconnect 11c and opening 13a that exposes second gate interconnect 12c have a rectangular opening having long sides with a length of 300 µm and short sizes with a length of 35 µm. Also, openings 13b that expose second drain interconnects 12b have a rectangular opening having long sides with a length of 1050 µm and short sides with a length of 35 µm.

The plurality of openings 13b do not need to extend greatly in the longitudinal direction of second drain interconnects 12b, but the larger the opening area, the shorter the interconnect length extending from second drain interconnects 12b to second common interconnects 17, which will be described later, will be, as a result of which the interconnect resistance and the interconnect inductance can be reduced.

As shown in FIG. 3, on second insulating film 13, a plurality of first drain pads 14 are formed that are connected to at least a part of first drain interconnects 11b via openings 13a. That is, first drain electrodes 1b and first drain pads 14 are electrically connected. The plurality of first drain pads 14 extend in a first direction.

On second insulating film 13, a plurality of first source pads 15 are formed that are connected to at least a part of second source interconnects 12a via openings 13a. That is, second source electrodes 2a and first source pads 15 are electrically connected. The plurality of first source pads 15 are disposed to extend in the first direction. First source pads 15 are partially disposed between adjacent second common interconnects 17.

On second insulating film 13, a plurality of first common interconnects 16 are formed that are connected to at least a part of first source interconnects 11a and second drain interconnects 12b via openings 13a. The plurality of first common interconnects 16 are disposed to extend in the first direction.

On second insulating film 13, a plurality of second common interconnects 17 are formed that are connected to at least a part of second drain interconnects 12b via openings 13b. The plurality of second common interconnects 17 are disposed to extend in a second direction that intersects with the first direction. First common interconnects 16 and second common interconnects 17 are connected to each other. That is, first source electrodes 1a and second drain electrodes 2b are electrically connected via first common interconnects 16 and second common interconnects 17.

On second insulating film 13, first gate pad 18 is formed that is connected to at least a part of first gate interconnect 11c via opening 13a, and second gate pad 19 is formed that is connected to at least a part of second gate interconnect 12c via opening 13a.

First drain pads 14, first source pads 15, first common interconnects 16, second common interconnects 17, first gate pad 18 and second gate pad 19 are formed by sequentially stacking a lower adhesion layer that has a thickness of about 100 nm and is made of Ti, a conductive layer that has a thickness of about 5 µm and is made of Cu, and an upper adhesion layer that has a thickness of about 100 nm and is made of Ni.

First drain pads 14 has a rectangular shape with a vertical length of 380 µm and a horizontal length of 220 µm. First source pads 15 has three types of rectangular shapes: a rectangular shape with a vertical length of 1300 µm and a horizontal length of 220 µm; a rectangular shape with a vertical length of 760 µm and a horizontal length of 220 µm; and a rectangular shape with a vertical length of 40 µm and a horizontal length of 220 µm.

First common interconnects 16 have a length L16 of 1850 µm and a width of 220 µm. Second common interconnects 17 have a length L17 of 1090 µm and a width of 40 µm. First gate pad 18 has a rectangular shape with a vertical length of 380 µm and a horizontal length of 250 µm. Second gate pad 19 has a rectangular shape with a vertical length of 380 µm and a horizontal length of 250 µm.

Interconnect pad 27 indicated by a dot-and-dash line in FIG. 3 has a rectangular shape with a vertical length of 850 µm and a horizontal length of 530 µm.

As shown in FIG. 4A, third insulating film 20 that has a thickness of about 10 µm and is made of PBO is formed on the structural elements shown in FIG. 3 such as first drain pads 14. In third insulating film 20, openings 21 are formed that partially expose first drain pads 14, first source pads 15, first gate pad 18, second gate pad 19 and interconnect pad 27. Openings 21 are sized to be slightly smaller than the size of the corresponding pads.

In the nitride semiconductor device according to the present embodiment, by forming first common interconnects 16, a half-bridge having high-side transistor 101 and low-side transistor 102 can be configured in a pad-on element structure. For this reason, it is possible to enable a smaller circuit area and reduce the interconnect resistance and the interconnect inductance as compared to a configuration in which two transistors are separately formed and connected with interconnects or the like on a circuit substrate. In addition, with the pad-on element structure, it is also possible to reduce the chip area.

In the case of a configuration in which second common interconnects 17 are not provided, because a plurality of first source pads 15 and a plurality of first common interconnects 16 are disposed in parallel, the directions in which electric current is extracted when flip-chip mounted are coincide with each other, and it is therefore difficult to aggregate electric currents flowing through first source pads 15 and first common interconnects 16 in one pad. In contrast, in the case of a configuration in which a plurality of first source pads 15 or a plurality of first common interconnects 16 are partially provided to extract electric current from the portion, the average interconnect length of interconnects extending from the first source electrodes 1a and the second source electrodes 2a to the extraction outlets is increased, which increases the interconnect resistance and the interconnect inductance.

To address this, as shown in FIG. 3, as a result of forming second common interconnects 17, a plurality of first common interconnects 16 can be connected on a chip, and it is therefore possible to reduce the interconnect resistance and the interconnect inductance between first common interconnects 16. With this configuration, electric current can be extracted from all of first source pads 15 and all of first common interconnects 16 without any increase in the interconnect resistance and the interconnect inductance when flip-chip mounted.

If mounting is performed by, instead of flip-chip mounting, using wire-bonding, ribbon-bonding or the like, electric current can be extracted from all of the pads irrespective of the presence or absence of second common interconnects 17, but because wires and ribbons have a high interconnect resistance and a high interconnect inductance, it is not possible to avoid an increase in the interconnect resistance and the interconnect inductance.

FIG. 4B is a plan view showing connecting portions connecting to a mounting circuit substrate on which the nitride semiconductor device according to the present embodiment is flip-chip mounted and metal plane layers on the mounting circuit substrate side. By forming second common interconnects 17, it is possible to aggregate electric currents flowing through all of first common interconnects 16 into second common interconnects 17, or in other words, circuit substrate-connecting portion 22 of the half-bridge switch node so that electric current can be extracted at switch node metal plane layer 30 on the mounting circuit substrate side.

Also, by forming openings 21 in third insulating film 20, isolated first source pads 15 formed between second common interconnects 17 can be connected to source metal plane layer 31 on the mounting circuit substrate via circuit substrate-connecting portion 23 of the plurality of first source pads without being interfered with first common interconnects 16 and second common interconnects 17. Accordingly, because the effective area of first source pads 15 can be increased, the interconnect resistance and the interconnect inductance can be reduced.

First drain pads 14 and drain metal plane layer 32 on the mounting circuit substrate side are electrically connected via circuit substrate-connecting portion 24 of the first drain pads. First gate pad 18 and high-side gate metal plane layer 33 on the mounting circuit substrate side are connected via circuit substrate-connecting portion 25 of the first gate pad. Also, second gate pad 19 and low-side gate metal plane layer 34 on the mounting circuit substrate side are connected via circuit substrate-connecting portion 26 of the second gate pad.

According to the nitride semiconductor device of Embodiment 1, it is possible to obtain a nitride semiconductor device having a small interconnect inductance.

In the present embodiment, an example is illustrated in which a part of first insulating film 5 as well as second insulating film 13 and third insulating film 20 are made of PBO, but it is also possible to use silicon oxide ($SiO_2$) films or the like. It is also possible to further form protruding terminals for flip-chip mounting such as solder balls on first drain pads 14, first source pads 15 or the like.

The dimensions of the nitride semiconductor device, the dimensions of high-side transistor 101 and the dimensions of low-side transistor 102 described in the embodiment given above are merely examples, and can be changed as appropriate according to the application, the required characteristics and the like of the nitride semiconductor device.

Also, the gate length of first gate electrodes 1c, the interval between the center of first gate electrode 1c and the center of first source electrode 1a, and the interval between the center of first gate electrode 1c and the center of first drain electrode 1b are also merely examples, and can be changed as appropriate according to the size, application and the like of the nitride semiconductor device.

The longitudinal length of first gate electrodes 1c, the longitudinal length of first source electrodes 1a, and the longitudinal length of first drain electrodes 1b are also merely examples, and can be changed as appropriate according to the size, application and the like of the nitride semiconductor device.

The width of first gate electrode interconnect 3 is also merely an example, and can be changed as appropriate according to the size, application and the like of the nitride semiconductor device.

In low-side transistor 102, the longitudinal length of second gate electrodes 2c, the longitudinal length of second source electrodes 2a, the longitudinal length of second drain electrodes 2b and the width of second gate electrode interconnect 4 are also merely examples, and can be changed as appropriate according to the size, application and the like of the nitride semiconductor device.

The length and width of first source interconnects 11a, the length and width of first drain interconnects 11b, and the interval between the interconnect ends of adjacent first source interconnect 11a and first drain interconnect 11b are also merely examples, and can be changed as appropriate according to the size, application and the like of the nitride semiconductor device.

The width of first gate interconnect 11c is also merely an example, and can be changed as appropriate according to the size, application and the like of the nitride semiconductor device.

The length and width of second source interconnects 12a, the length and width of second drain interconnects 12b, and the interval between the interconnect ends of adjacent second source interconnect 12a and second drain interconnect 12b are also merely examples, and can be changed as appropriate according to the size, application and the like of the nitride semiconductor device.

The width of second gate interconnect 12c is also merely an example, and can be changed as appropriate according to the size, application and the like of the nitride semiconductor device.

The shape and dimensions of openings 5a that expose first source electrodes 1a, openings 5a that expose first drain electrodes 1b, openings 5a that expose second source electrodes 2a and openings 5a that expose second drain electrodes 2b are not limited to those described above.

Also, the shape and dimensions of openings 5a that expose first gate electrode interconnect 3 and openings 5a that expose second gate electrode interconnect 4 are not limited to those described above, either.

The shape and dimensions of openings 13a and the shape and dimensions of openings 13b are not limited to those described above, either.

The shape and dimensions of first drain pads 14 and first source pads 15 are not limited to those described above, either.

The length L16 and width of first common interconnects 16 and the length L17 and width of second common interconnects 17 are not limited to those described above, either.

The shape and dimensions of first gate pad 18 are not limited to those described above, either.

The shape and dimensions of interconnect pad 27 are not limited to those described above, either.

Variation 1 of Embodiment 1

Figure 6A:
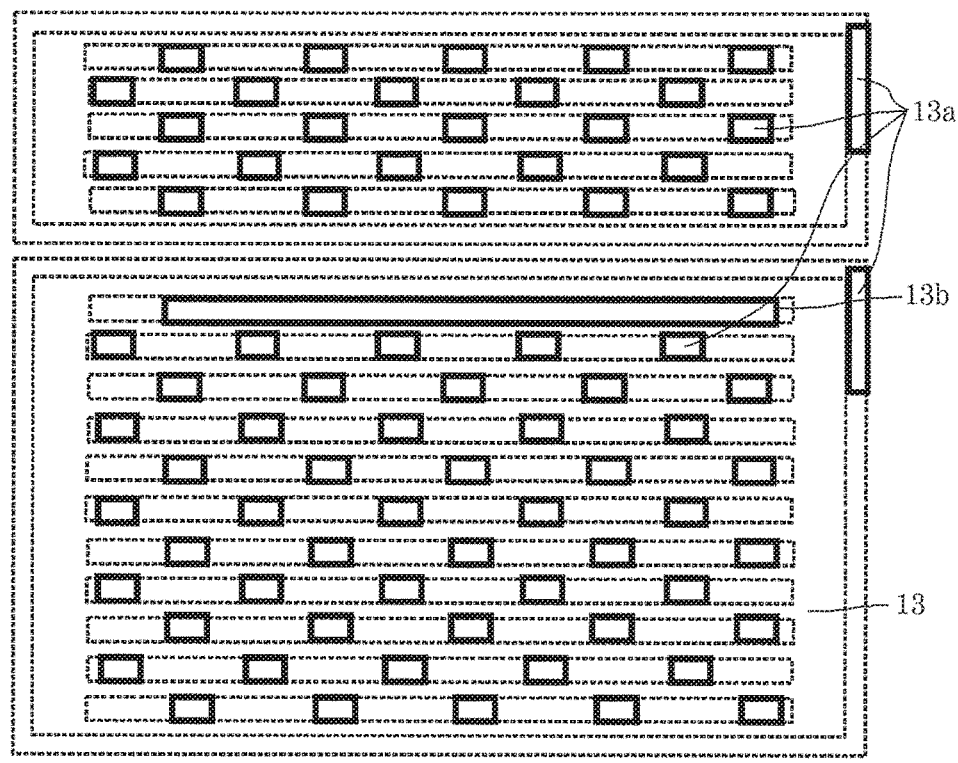
FIG. 6A is a plan view showing a layer corresponding to FIG. 2B in a nitride semiconductor device according to Variation 1 of Embodiment 1.

Hereinafter, a nitride semiconductor device according to Variation 1 of Embodiment 1 of the present disclosure will be described with reference to FIGS. 6A and 6B. In the present variation; a description of the structural elements that are substantially the same as those of Embodiment 1 may be omitted.

The nitride semiconductor device according to the present variation includes only one second common interconnect 17. To be specific, a layer shown in FIG. 6A corresponds to the layer shown in FIG. 2B described in Embodiment 1. They are different in that only one opening 13b extending greatly in the longitudinal direction of second drain interconnects 12b is formed in second insulating film 13, rather than a plurality of openings 13b.

Figure 6B:
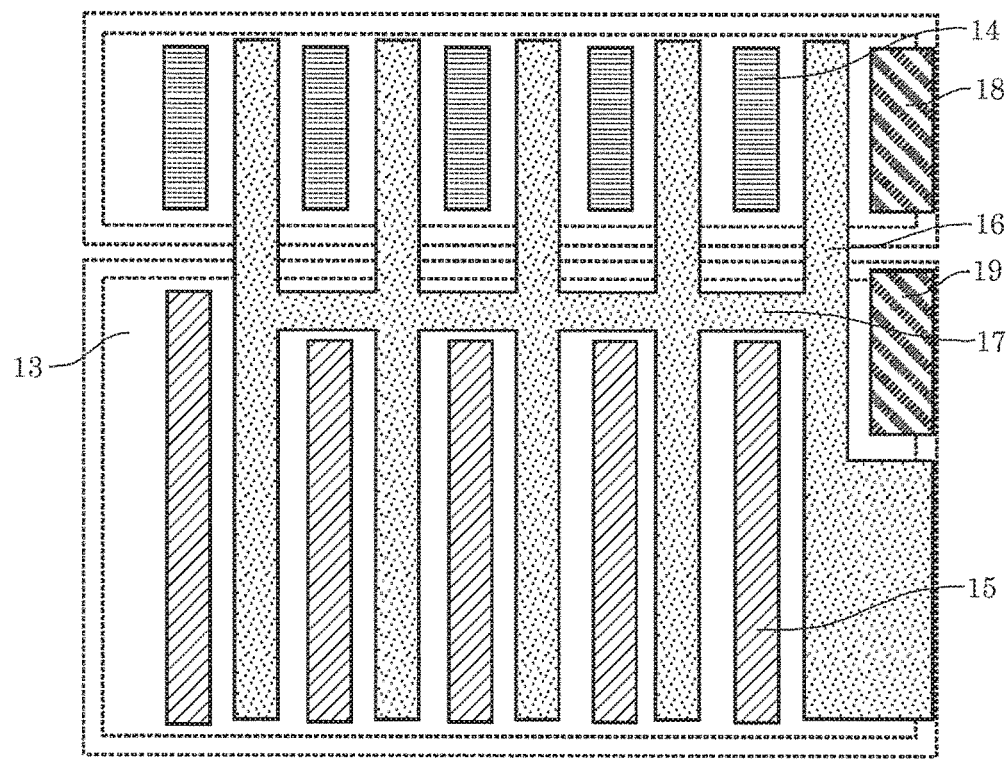
FIG. 6B is a plan view showing an upper layer overlying the layer shown in FIG. 6A.

A layer shown in FIG. 6B corresponds to the layer shown in FIG. 3 described in Embodiment 1. They are different in that only one second common interconnect 17 is provided. Second common interconnect 17 is connected to second drain interconnect 12b via openings 13b shown in FIG. 6A, and intersects with and is connected to a plurality of first common interconnects 16.

According to the present variation, in addition to the same effects as those of Embodiment 1, the following effects can be obtained: the area of first source pads 15 can be increased by an amount corresponding to the reduced number of second common interconnects 17. As a result, the average interconnect length of interconnects extending from second source electrodes 2a to first source pads 15 is reduced, and thus the interconnect resistance and the interconnect inductance of the source of low-side transistor 102 can be reduced.

Also, the contact area with respect to the mounting circuit substrate when flip-chip mounted can be increased, and it is therefore possible to reduce the contact resistance as well. Also, as in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

As shown in FIG. 6B, as a result of disposing one second common interconnect 17 in a position closest to the high-side transistor, electric current can be extracted without first source pads 15 and second common interconnects 17 intersecting with each other when flip-chip mounted. In the case where one second common interconnect 17 is not disposed near the high-side transistor, as in Embodiment 1, the area of first source pads 15 can be increased by the use of third insulating film 20 and openings 21 in an upper layer overlying the layer shown in FIG. 6B, and thus electric current can be easily extracted without being interfered with second common interconnect 17.

According to the nitride semiconductor device of Variation 1 of Embodiment 1, it is possible to obtain a nitride semiconductor device having a small interconnect inductance.

Variation 2 of Embodiment 1

A nitride semiconductor device according to Variation 2 of Embodiment 1 will be described with reference to FIGS. 7A and 7B. In the present variation, a description of the structural elements that are substantially the same as those of Embodiment 1 may be omitted.

In the nitride semiconductor device according to the present variation, a plurality of first common interconnects 16 include first vertical interconnect 41, second vertical interconnect 42 and third vertical interconnect 43 that are disposed adjacent to each other, and a plurality of second common interconnects 17 include first horizontal interconnect 44, second horizontal interconnects 45a and 45b and third horizontal interconnect 46. First vertical interconnect 41 and second vertical interconnect 42 are connected by first horizontal interconnect 44 and second horizontal interconnects 45a and 45b, and second vertical interconnect 42 and third vertical interconnect 43 are connected by third horizontal interconnect 46. As viewed in plan view, third horizontal interconnect 46 is disposed in a position between first horizontal interconnect 44 and second horizontal interconnect 45b in the first direction.

Figure 7A:
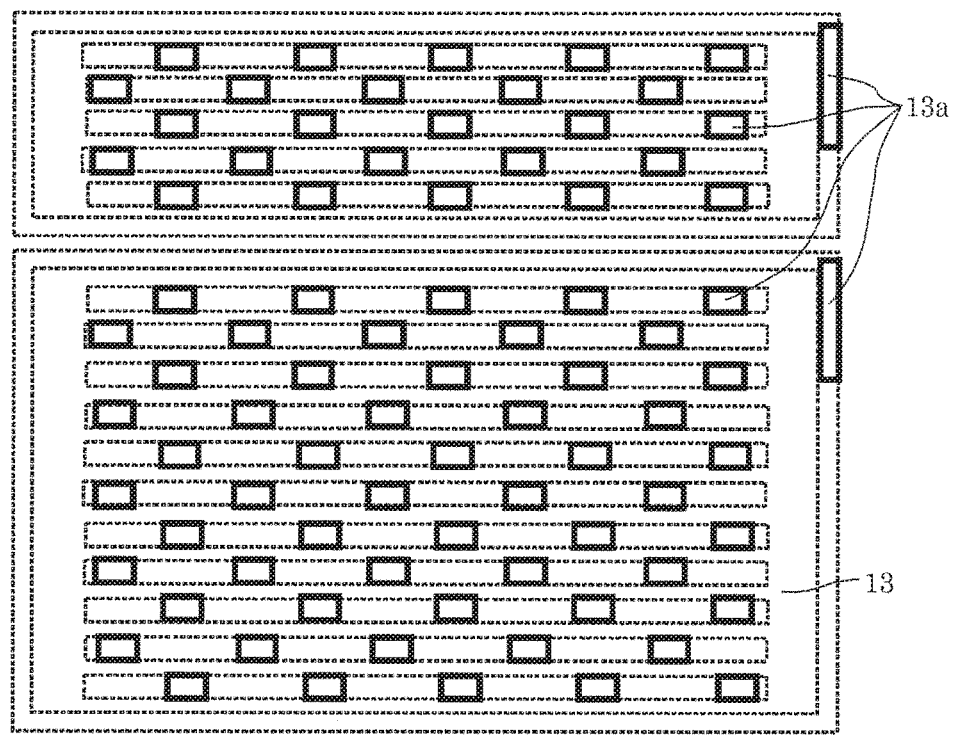
FIG. 7A is a plan view showing a layer corresponding to FIG. 2B in a nitride semiconductor device according to Variation 2 of Embodiment 1.

A layer shown in FIG. 7A corresponds to the layer shown in FIG. 2B described in Embodiment 1. They are different in that openings 13b extending greatly in the longitudinal direction of second drain interconnects 12b are not formed in second insulating film 13.

Figure 7B:
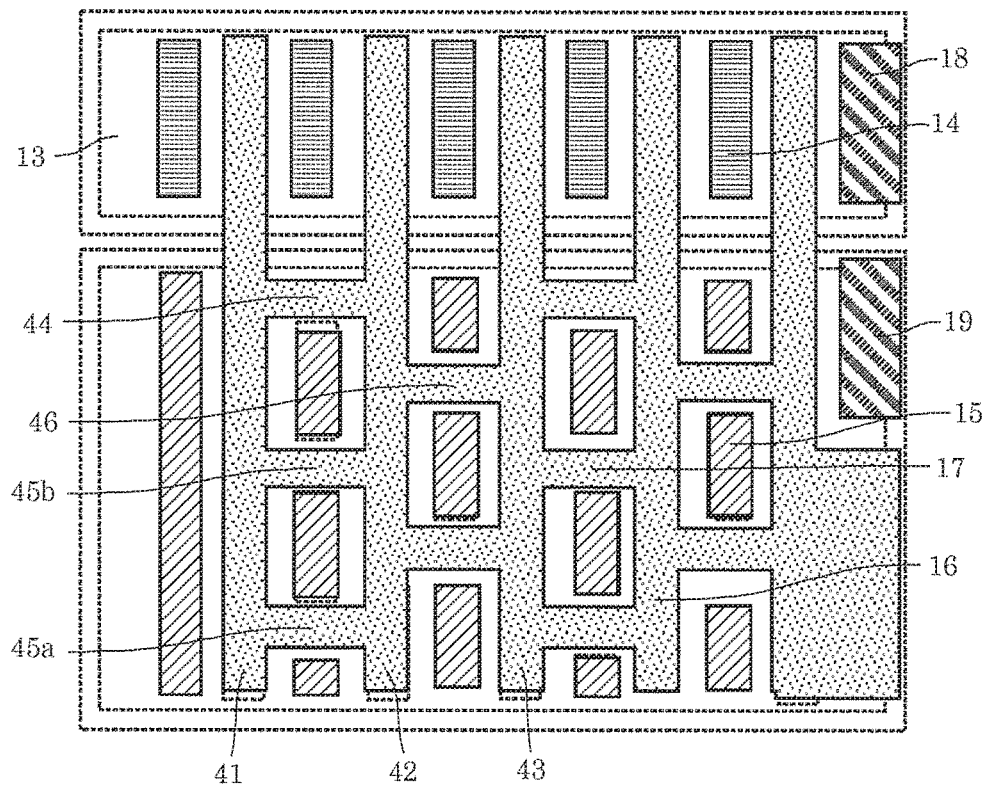
FIG. 7B is a plan view showing an upper layer overlying the layer shown in FIG. 7A.

A layer shown in FIG. 7B corresponds to the layer shown in FIG. 3 described in Embodiment 1. In the present variation, first common interconnects 16 and second common interconnects 17 are disposed in a grid pattern by using horizontal interconnects and vertical interconnects.

According to the present variation, in addition to the same effects as those of Embodiment 1, the following effects can be obtained: as a result of disposing first common interconnects 16 and second common interconnects 17 in a grid pattern, the average length of interconnects in the longitudinal direction from first common interconnects 16 to second common interconnects 17 can be shortened, and thus the interconnect resistance and the interconnect inductance of the interconnects extending to the current extraction outlet as the switch node can be reduced.

In FIG. 7B, first horizontal interconnect 44, second horizontal interconnect 45b and third horizontal interconnect 46 are disposed adjacent to each other, but second horizontal interconnect 45b may be omitted. The horizontal interconnect and the vertical interconnects may be disposed as appropriate such that a desired interconnect resistance and a desired interconnect inductance can be achieved.

Also, the area of first source pads 15 can be increased by forming first source pads 15 between first common interconnects 16 and second common interconnects 17 that are disposed in a grid pattern. As a result, the average interconnect length of interconnects extending from second source electrodes 2a to first source pads 15 can be reduced, and thus the interconnect resistance and the interconnect inductance of the source of low-side transistor 102 can be reduced. At this time, as in Embodiment 1, the area of first source pads 15 can be increased by the use of third insulating film 20 and openings 21 of third insulating film 20, and electric current can be easily extracted without being interfered with second common interconnects 17.

In a region below first horizontal interconnect 44, second horizontal interconnects 45a and 45b and third horizontal interconnect 46, openings 13a of second insulating film 13 may extend greater in the longitudinal direction of the horizontal interconnects. With this configuration, the interconnect resistance and the interconnect inductance in a region between first vertical interconnect 41 and second vertical interconnect 42 and a region between second vertical interconnect 42 and third vertical interconnect 43 can be reduced. In addition, as in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

According to the nitride semiconductor device of Variation 2 of Embodiment 1, it is possible to obtain a nitride semiconductor device having a small interconnect inductance.

Variation 3 of Embodiment 1

Hereinafter, a nitride semiconductor device according to Variation 3 of Embodiment 1 will be described with reference to FIGS. 8A and 8B. In the present variation, a description of the structural elements that are substantially the same as those of Embodiment 1 may be omitted.

In the nitride semiconductor device according to the present variation, a plurality of first common interconnects 16 include first vertical interconnect 41, second vertical interconnect 42 and third vertical interconnect 43 that are disposed adjacent to each other, and a plurality of second common interconnects 17 include first horizontal interconnect 44, second horizontal interconnect 45 and third horizontal interconnect 46. First vertical interconnect 41 and second vertical interconnect 42 are connected by first horizontal interconnect 44 and second horizontal interconnect 45, and second vertical interconnect 42 and third vertical interconnect 43 are connected by third horizontal interconnect 46. As viewed in plan view, third horizontal interconnect 46 is disposed in a position between first horizontal interconnect 44 and second horizontal interconnect 45 in the first direction, and second common interconnect 17 covers a part of a plurality of first source pads 15 and a part of a plurality of first drain pads 14.

Figure 8A:
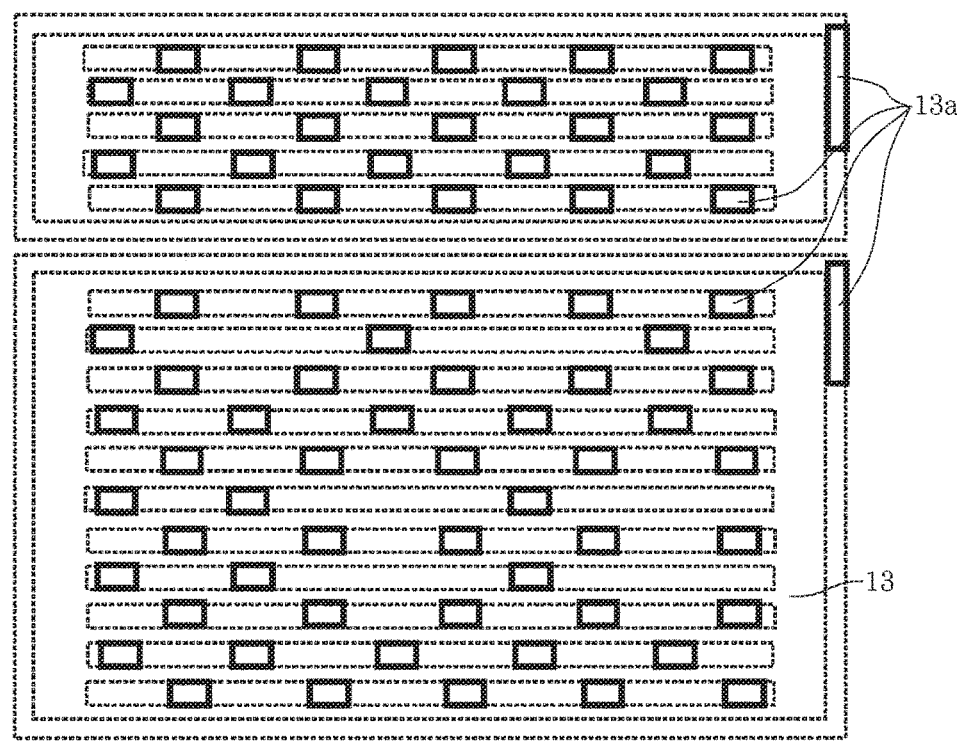
FIG. 8A is a plan view showing a layer corresponding to FIG. 7A in a nitride semiconductor device according to Variation 3 of Embodiment 1.

A layer shown in FIG. 8A corresponds to the layer shown in FIG. 7A according to Variation 2 of Embodiment 1. As shown in FIG. 8A, in the present variation, the arrangement of openings 13a formed in second insulating film 13 formed on second source interconnects 12a is different from that of Variation 2. To be specific, the present variation is different from Variation 2 in that in a low-side transistor according to the present variation, there are regions where there is no opening 13a.

Figure 8B:
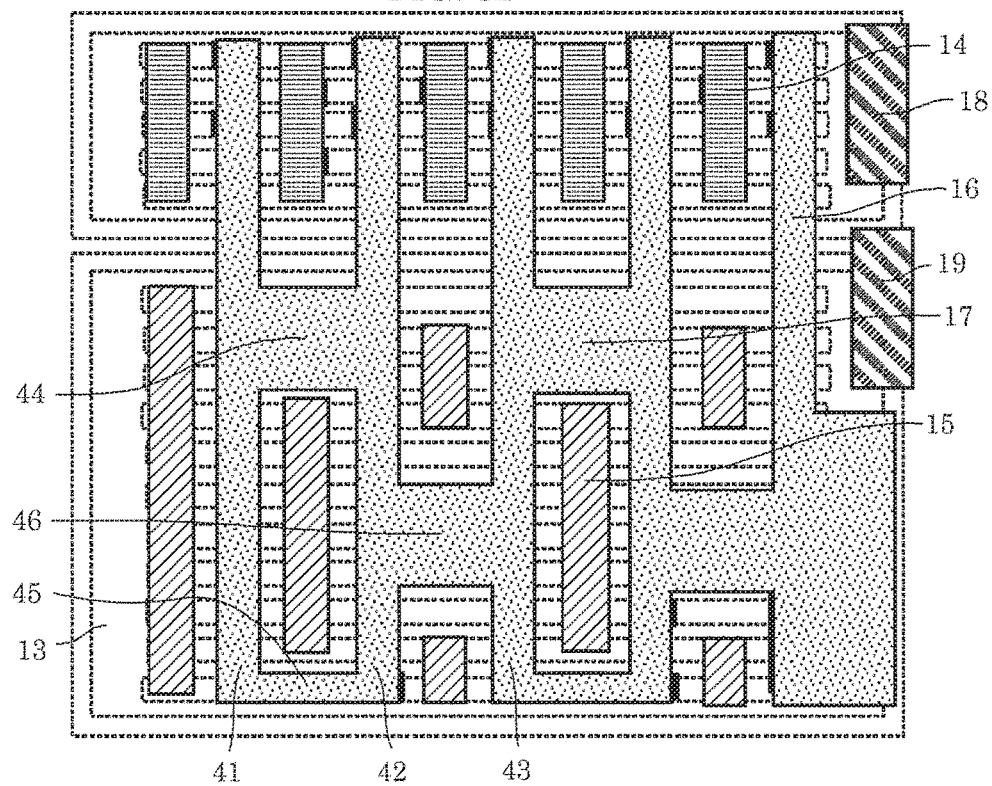
FIG. 8B is a plan view showing an upper layer overlying the layer shown in FIG. 8A.

A layer shown in FIG. 8B corresponds to the layer shown in FIG. 7B according to Variation 2 of Embodiment 1. As shown in FIG. 8B, second common interconnect 17 is disposed so as to cover the regions where there is no opening 13a.

According to the present variation, in addition to the same effects as those of Embodiment 1, the following effects can be obtained. Because wide second common interconnect 17 can be formed, the area of second common interconnects 17 can be increased. For this reason, the interconnect resistance and the interconnect inductance of the interconnects extending to the current extraction outlet as the switch node can be reduced.

The average interconnect length of interconnects extending from a point in second source interconnects 12a covered with second common interconnect 17 to first source pads 15 is longer than the average interconnect length of interconnects extending from a point in second source interconnects 12a that are not covered with second common interconnects 17 to first source pads 15. However, in the case where first source pads 15 are disposed between first common interconnects 16 and second common interconnects 17 that are disposed in a grid pattern, electric current can reach first source pads 15 by passing through second source interconnects 12a corresponding to the length of second common interconnect 17 in the second direction, and thus an increase in the interconnect resistance and the interconnect inductance can be suppressed.

As in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

According to the nitride semiconductor device of Variation 3 of Embodiment 1, it is possible to obtain a nitride semiconductor device having a small interconnect inductance.

Embodiment 2

Hereinafter, a nitride semiconductor device according to Embodiment 2 will be described with reference to the drawings. In the present embodiment, a description of the structural elements that are substantially the same as those of the embodiment and variations described above may be omitted.

In the nitride semiconductor device according to Embodiment 2, the layers respectively shown in FIGS. 1A, 1B, 2A and 7A described in Embodiment 1 are formed in this order.

Figure 9A:
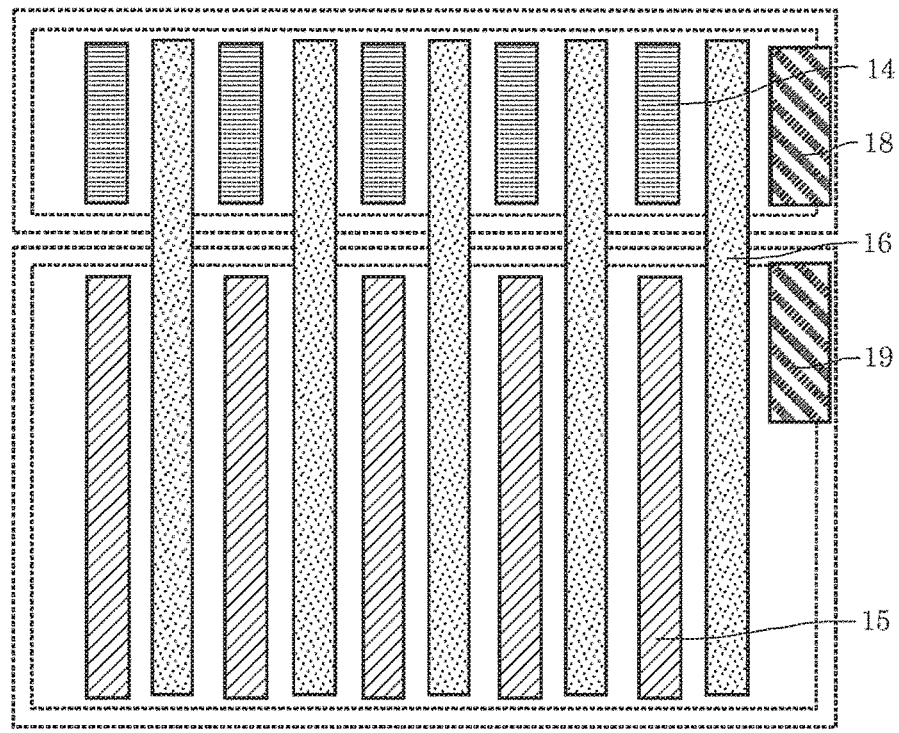
FIG. 9A is a plan view showing a layer corresponding to FIG. 3 in a nitride semiconductor device according to Embodiment 2.

A layer shown in FIG. 9A is provided on the layer shown in FIG. 7A and corresponds to the layer shown in FIG. 3 described in Embodiment 1. In the layer shown in FIG. 9A, there is no second common interconnect 17, and a plurality of first common interconnects 16 are not connected to each other.

Figure 9B:
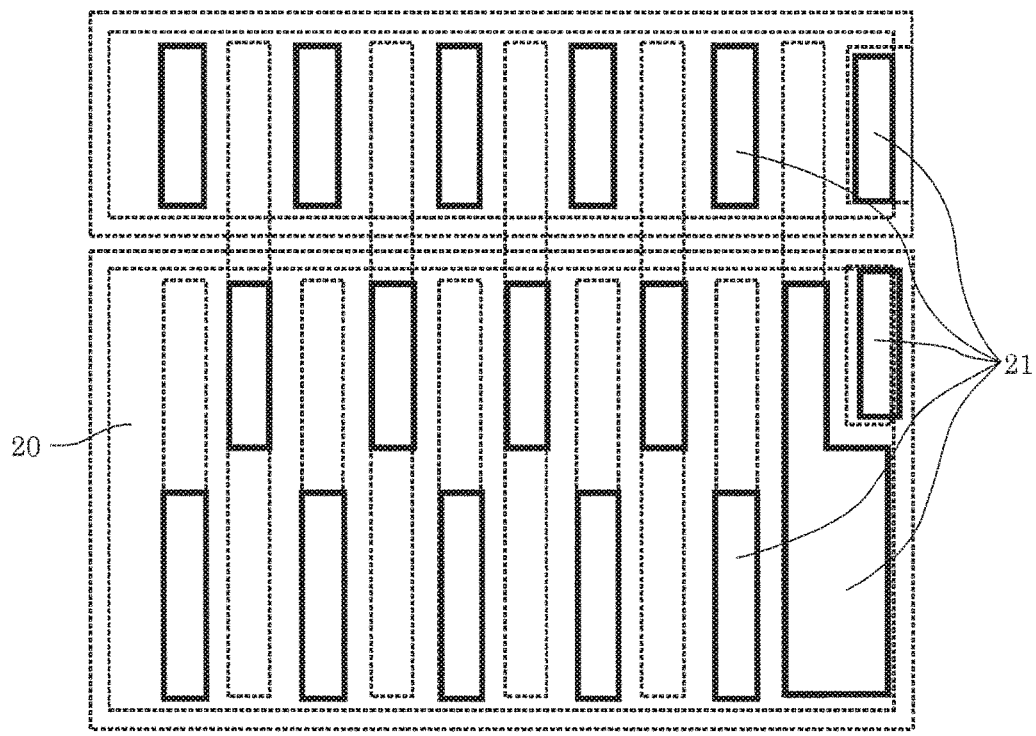
FIG. 9B is a plan view showing an upper layer overlying the layer shown in FIG. 9A.

As shown in FIG. 9B, on the layer shown in FIG. 9A having first drain pads 14 and the like, third insulating film 20 that has a thickness of about 10 μm and is made of PBO is formed. In third insulating film 20, a plurality of openings 21 are formed that partially expose first drain pads 14, first source pads 15, first common interconnects 16, first gate pad 18 and second gate pad 19, respectively.

Figure 10:
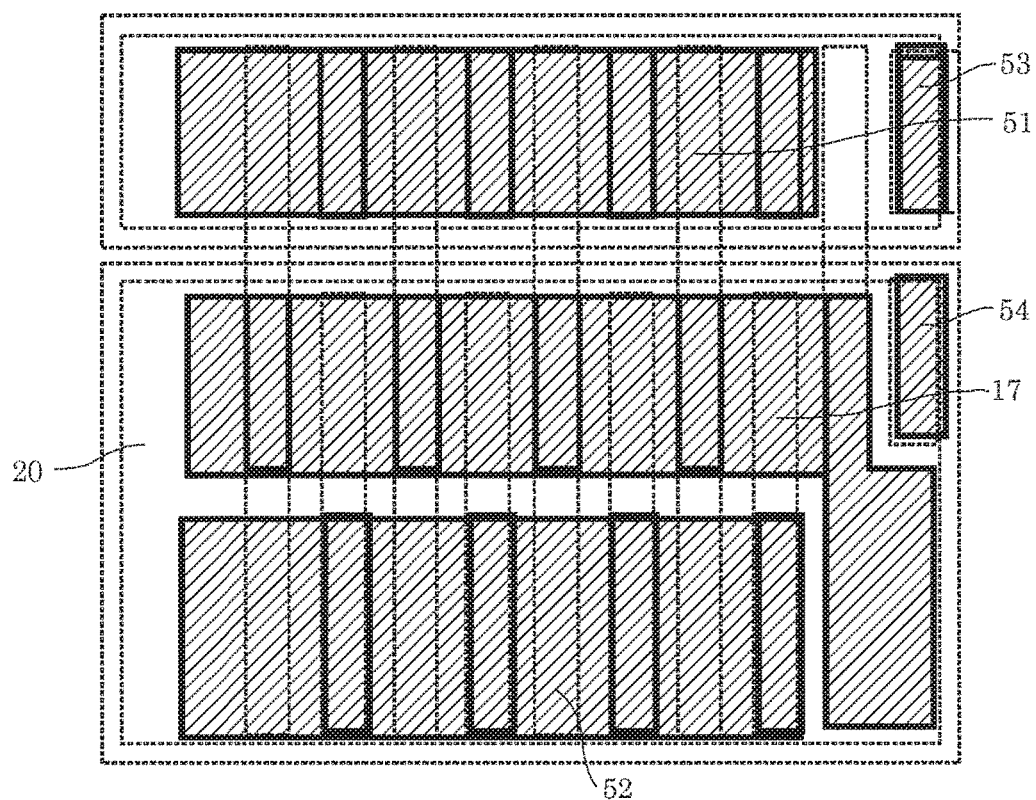
FIG. 10 is a plan view showing an upper layer overlying the layer shown in FIG. 9B.

As shown in FIG. 10, on third insulating film 20, second common interconnect 17 that is connected to a part of first common interconnects 16 via openings 21 is formed. That is, first source electrodes 1a and second drain electrodes 2b are electrically connected to first common interconnects 16 and second common interconnects 17.

This configuration requires an additional interconnect forming step as compared with Embodiment 1, but because there is no second common interconnect 17 in the layer shown in FIG. 9A, the area of first source pads 15 can be increased accordingly. Thus, the average interconnect length of interconnects extending from second source electrodes 2a to first source pads 15 can be shortened, and the interconnect resistance and the interconnect inductance of the source of low-side transistor 102 can therefore be reduced.

In the layer shown in FIG. 10, because a plurality of first common interconnects 16 can be connected on a chip by second common interconnect 17, electric current can be extracted from all of first common interconnects 16 when flip-chip mounted, and thus the interconnect resistance and the interconnect inductance can be reduced.

In addition, as in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

Also, second drain pad 51 that is connected to at least a part of first drain pads 14 via openings 21 is formed. That is, first drain electrodes 1b and second drain pad 51 are electrically connected. Also, second source pad 52 that is connected to at least a part of first source pads 15 via openings 21 is formed. That is, second source electrodes 2a and second source pad 52 are electrically connected. Also, on third insulating film 20, third gate pad 53 is connected to at least a part of first gate pad 18 via opening 21, and fourth gate pad 54 is connected to at least a part of second gate pad 19 via opening 21.

In the layer shown in FIG. 10, the pads other than second common interconnect 17 do not need to be formed, but by forming all of the pads, it is possible to obtain an advantage of ease of mounting because all pads including second common interconnect 17 are located substantially in the same plane.

Second drain pad 51, second source pad 52, second common interconnect 17, third gate pad 53 and fourth gate pad 54 are formed by sequentially stacking a lower adhesion layer that has a thickness of about 100 nm and is made of Ti, a conductive layer that has a thickness of about 5 μm and is made of Cu, and an upper adhesion layer that has a thickness of about 100 nm and is made of Ni.

According to the nitride semiconductor device of Embodiment 2, it is possible to obtain a nitride semiconductor device having a small interconnect inductance.

Embodiment 3

Hereinafter, a nitride semiconductor device according to Embodiment 3 will be described with reference to the drawings. In the present embodiment, a description of the structural elements that are substantially the same as those of the embodiments and the variations described above is omitted, and only structural elements that are different from those of the embodiments and the variations described above will be described.

The nitride semiconductor device according to Embodiment 3 includes nitride semiconductor element 200 and mounting circuit substrate 201. In nitride semiconductor element 200, the layers respectively shown in FIGS. 1A, 1B, 3A and 7A described in Embodiment 1 and the layer shown in FIG. 9A described in Embodiment 2 are formed in this order. Note that in FIG. 9A, there is no second common interconnect 17.

Figure 11:
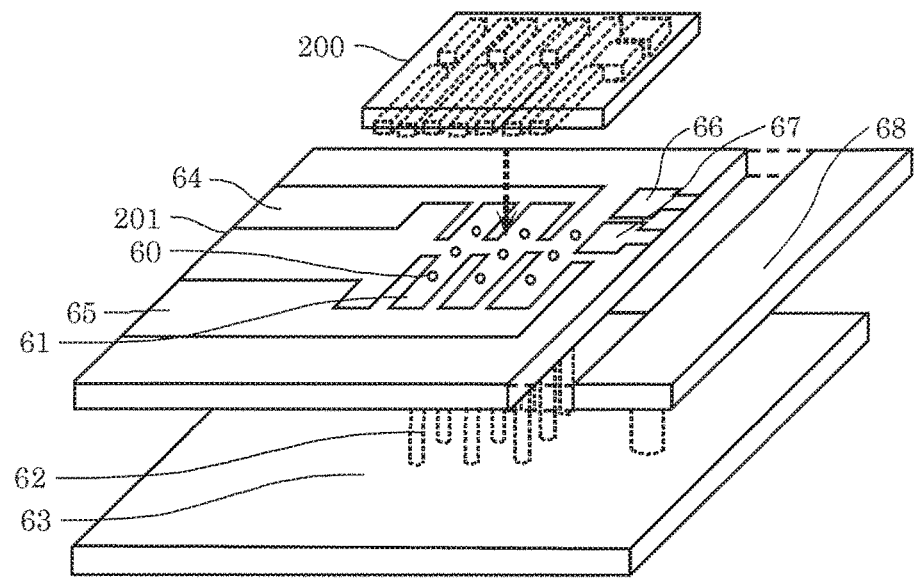
FIG. 11 is an exploded perspective view showing a structure of a nitride semiconductor device according to Embodiment 3.

The surface of mounting circuit substrate 201 shown in FIG. 11 has at least one first via hole opening 60, and first metal plane layer 61 is formed that is electrically connected to a switch node of nitride semiconductor element 200, or in other words, a plurality of first common interconnects 16 of nitride semiconductor element 200 when flip-chip mounted.

Also, mounting circuit substrate 201 includes third common interconnect 63 that is electrically connected to first metal plane layer 61 via first via holes 62 provided within first via hole openings 60. In mounting circuit substrate 201, third common interconnect 63 is disposed in a layer different from that of first metal plane layer 61.

Furthermore, mounting circuit substrate 201 includes drain metal plane layer 64 that is electrically connected to first drain pads 14 of nitride semiconductor element 200, source metal plane layer 65 that is electrically connected to first source pads 15, high-side gate metal plane layer 66 that is electrically connected to first gate pad 18, low-side gate metal plane layer 67 that is electrically connected to second gate pad 19, and switch node metal plane layer 68 that is electrically connected to third common interconnect 63.

With this configuration, second common interconnects 17 is not disposed in nitride semiconductor element 200, and thus the area of first source pads 15 can be increased accordingly. Thus, the average interconnect length of interconnects extending from second source electrodes 2a to first source pads 15 can be reduced, and the interconnect resistance and the interconnect inductance of the source of low-side transistor 102 can therefore be reduced.

With third common interconnect 63, a plurality of first common interconnects 16 can be connected in one layer of mounting circuit substrate 201, and thus electric current can be extracted from all of first common interconnects 16 when nitride semiconductor element 200 is flip-chip mounted. Accordingly, the interconnect resistance and inductance of interconnects that are connected to the source of high-side transistor 101 and the drain of low-side transistor 102 can be reduced as compared to the configuration in which two transistors are separately formed and interconnected. The interconnect resistance and the interconnect inductance can be reduced.

As in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

In order to obtain switch node metal plane layer 68 having the same potential as that of third common interconnect 63 on the surface of mounting circuit substrate 201 in the actual use, third common interconnect 63 and switch node metal plane layer 68 may be connected through via holes or the like.

According to the nitride semiconductor device of Embodiment 3, it is possible to obtain a nitride semiconductor device having a small interconnect inductance.

Variation 1 of Embodiment 3

Hereinafter, a nitride semiconductor device according to Variation 1 of Embodiment 3 will be described with reference to the drawings as appropriate. In the present variation, a description of the structural elements that are substantially the same as those of the embodiments and the variations described above may be omitted.

The nitride semiconductor device according to Variation 1 of Embodiment 3 includes nitride semiconductor element 200 and mounting circuit substrate 201. In nitride semiconductor element 200, the layers respectively shown in FIGS. 1A, 1B, 4A and 7A described in Embodiment 1 and the layer shown in FIG. 9A described in Embodiment 2 are formed in this order. Note that in FIG. 9A, there is no second common interconnect 17.

Figure 12:
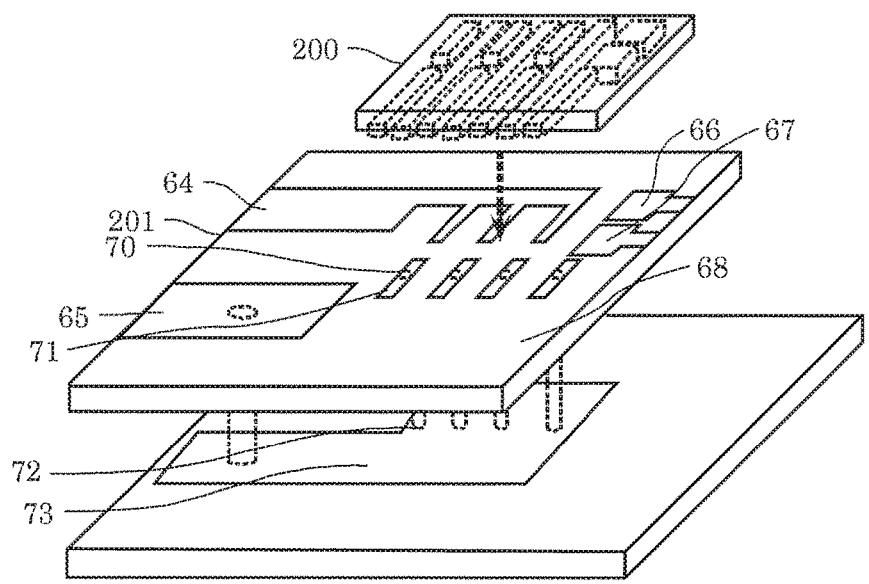
FIG. 12 is an exploded perspective view showing a structure of a nitride semiconductor device according to Variation 1 of Embodiment 3.

As shown in FIG. 12, the surface of mounting circuit substrate 201 has at least one second via hole opening 70, and second metal plane layer 71 is formed that is electrically connected to a switch node of nitride semiconductor element 200, or in other words, a plurality of first source pads 15 of nitride semiconductor element 200 when flip-chip mounted.

Mounting circuit substrate 201 includes fourth common interconnect 73 electrically connected to second metal plane layer 71 via second via holes 72 formed within second via hole openings 70. In mounting circuit substrate 201, fourth common interconnect 73 is disposed in a layer different from second metal plane layer 71.

Furthermore, mounting circuit substrate 201 includes drain metal plane layer 64 that is electrically connected to first drain pads 14 of nitride semiconductor element 200, switch node metal plane layer 68 that is electrically connected to first common interconnects 16, high-side gate metal plane layer 66 that is electrically connected to first gate pad 18, low-side gate metal plane layer 67 that is electrically connected to second gate pad 19, and source metal plane layer 65 that is electrically connected to fourth common interconnect 73.

With this configuration, no second common interconnect 17 is disposed on nitride semiconductor element 200, and thus the area of first source pads 15 can be increased accordingly. Thus, the interconnect resistance and the interconnect inductance of interconnects extending from second source interconnects 12a of low-side transistor 102 to second metal plane layer 71 can be reduced. Also, the contact area with respect to the mounting circuit substrate when flip-chip mounted can be increased, and thus the contact resistance can be reduced as well. The average interconnect length of interconnects extending from second source electrodes 2a to first source pads 15 can be reduced. Accordingly, the interconnect resistance and the interconnect inductance of the source of low-side transistor 102 can be reduced.

Also, with switch node metal plane layer 68, a plurality of first common interconnects 16 can be connected on one layer of mounting circuit substrate 201, and thus electric current can be extracted from all of first common interconnects 16 when nitride semiconductor element 200 is flip-chip mounted. Accordingly, the interconnect resistance and the interconnect inductance can be reduced.

In addition, as in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

In order to obtain source metal plane layer 65 having the same potential as that of first source pads 15 on the surface of mounting circuit substrate 201 in the actual use, first source pads 15 and source metal plane layer 65 may be connected through via holes or the like.

According to the nitride semiconductor device of Variation 1 of Embodiment 3, it is possible to obtain a nitride semiconductor device having a small interconnect inductance.

Variation 2 of Embodiment 3

Hereinafter, a nitride semiconductor device according to Variation 2 of Embodiment 3 will be described with reference to the drawings as appropriate. In the present variation, a description of the structural elements that are substantially the same as those of the embodiments and the variations described above may be omitted.

The nitride semiconductor device according to Variation 2 of Embodiment 3 includes nitride semiconductor element 200 and mounting circuit substrate 201. In nitride semiconductor element 200, the layers respectively shown in FIGS. 1A, 1B, 4A and 7A described in Embodiment 1 and the layer shown in FIG. 9A described in Embodiment 2 are formed in this order in the substantially the same manner. Note that in FIG. 9A, there is no second common interconnect 17.

Figure 13:
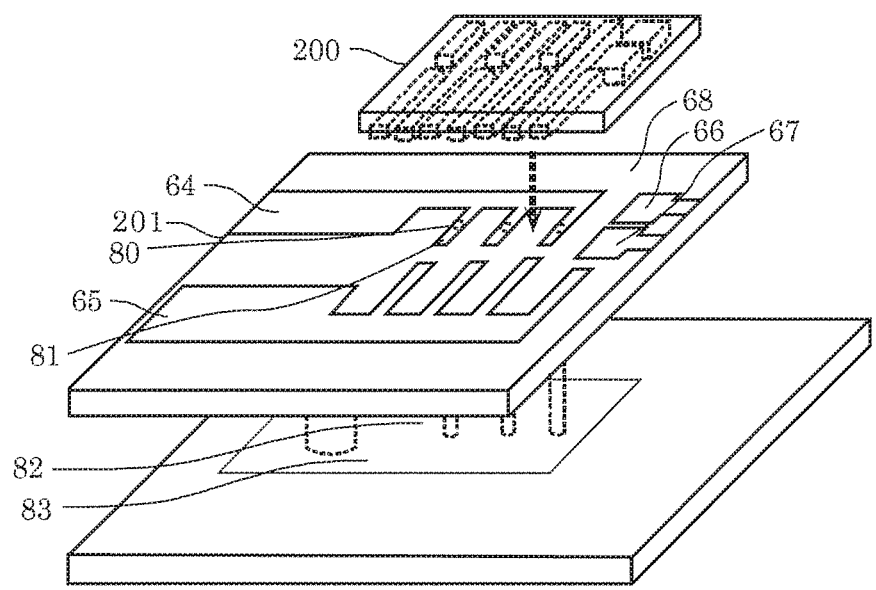
FIG. 13 is an exploded perspective view showing a structure of a nitride semiconductor device according to Variation 2 of Embodiment 3.

As shown in FIG. 13, the surface of mounting circuit substrate 201 has at least one third via hole opening 80, and third metal plane layer 81 is formed that is electrically connected to a switch node of nitride semiconductor element 200, or in other words, a plurality of first drain pads 14 of nitride semiconductor element 200 when flip-chip mounted.

Also, mounting circuit substrate 201 includes fifth common interconnect 83 that is electrically connected to third metal plane layer 8182 via third via holes 82 formed within third via hole openings 80. In mounting circuit substrate 201, fifth common interconnect 83 is disposed in a layer different from third metal plane layer 81.

Furthermore, mounting circuit substrate 201 includes source metal plane layer 65 that is electrically connected to first source pads 15 of nitride semiconductor element 200, switch node metal plane layer 68 that is electrically connected to first common interconnects 16, high-side gate metal plane layer 66 that is electrically connected to first gate pad 18, low-side gate metal plane layer 67 that is electrically connected to second gate pad 19, and drain metal plane layer 64 that is electrically connected to fifth common interconnect 83.

With this configuration, no second common interconnect 17 is disposed on nitride semiconductor element 200, and thus the area of first source pads 15 can be increased accordingly. Thus, the average interconnect length of interconnects extending from second source electrodes 2a to first source pads 15 can be reduced, and the interconnect resistance and the interconnect inductance of the source of low-side transistor 102 can therefore be reduced.

Also, with switch node metal plane layer 68, a plurality of first common interconnects 16 can be connected on mounting circuit substrate 201, and thus electric current can be extracted from all of first common interconnects 16 when nitride semiconductor element 200 is flip-chip mounted. Accordingly, the interconnect resistance and inductance of interconnects that are connected to the source of high-side transistor 101 and the drain of low-side transistor 102 can be reduced as compared to the configuration in which two transistors are separately formed and interconnected. The interconnect resistance and the interconnect inductance can be reduced.

In addition, as in Embodiment 1, a half-bridge including high-side transistor 101 and low-side transistor 102 can be formed with a pad-on element structure by forming first common interconnects 16, and thus the circuit area can be made small, and the interconnect resistance and the interconnect inductance can be reduced as compared to the configuration in which two transistors are separately formed and connected with interconnects or the like on a circuit substrate.

In order to obtain drain metal plane layer 64 having the same potential as that of first drain pads 14 on the surface of mounting circuit substrate 201 in the actual use, first drain pads 14 and drain metal plane layer 64 may be connected through via holes or the like.

According to the nitride semiconductor device of Variation 2 of Embodiment 3, it is possible to obtain a nitride semiconductor device having a small interconnect inductance.

Up to here, examples have been described in which the semiconductor devices according to the present disclosure are nitride semiconductor devices. The present disclosure is not limited to nitride semiconductor devices, and is applicable to a lateral device made of a material such as silicon (Si) or silicon carbide (SiC).

INDUSTRIAL APPLICABILITY

The present invention can be widely used as a semiconductor device of a half-bridge configuration such as, for example, a DC/DC converter or an audio class D amplifier.

The invention claimed is:

1. A semiconductor device comprising:
a substrate;
a semiconductor layer disposed on the substrate;
a first transistor including a first gate electrode, a plurality of first drain electrodes and a plurality of first source electrodes that are disposed vertically above the semiconductor layer;
a second transistor including a second gate electrode, a plurality of second drain electrodes and a plurality of second source electrodes that are disposed vertically above the semiconductor layer;
first drain pads that are disposed vertically above the first drain electrodes, are electrically connected to the first drain electrodes, and extend in a first direction;
a plurality of first source pads that are disposed vertically above the second source electrodes, are electrically connected to the second source electrodes, and extend along the first direction;
a plurality of first common interconnects, each of which is continuously disposed from vertically above one of the first source electrodes to vertically above one of the second drain electrodes, is electrically connected to the one of the first source electrodes and the one of the second drain electrodes, and extends in the first direction; and
a plurality of second common interconnects, each of which is connected to the first common interconnects, and extends in a second direction that intersects with the first direction,
wherein the plurality of first common interconnects and the plurality of second common interconnects are disposed in a same layer, and
wherein each of the plurality of second common interconnects is directly connected to the first common interconnects.

2. The semiconductor device according to claim 1, wherein the plurality of first source pads are each disposed between an adjacent pair of the plurality of second common interconnects.

3. The semiconductor device according to claim 1, wherein the plurality of first common interconnects include a first vertical interconnect, a second vertical interconnect and a third vertical interconnect,
the plurality of second common interconnects include a first horizontal interconnect, a second horizontal interconnect and a third horizontal interconnect,
the first vertical interconnect and the second vertical interconnect are connected by the first horizontal interconnect and the second horizontal interconnect,
the second vertical interconnect and the third vertical interconnect are connected by the third horizontal interconnect, and
the third horizontal interconnect is, as viewed in plan view, disposed in a position between the first horizontal interconnect and the second horizontal interconnect in the first direction.

4. The semiconductor device according to claim 3, wherein the first vertical interconnect, the second vertical interconnect and the third vertical interconnect are disposed adjacent to each other, and
the first horizontal interconnect, the second horizontal interconnect and the third horizontal interconnect are disposed adjacent to each other.

5. The semiconductor device according to claim 1, wherein a plurality of second source interconnects and a plurality of second drain interconnects that extend in the second direction are disposed vertically above the second transistor and below the plurality of first common interconnects.

6. The semiconductor device according to claim 5, wherein the plurality of second common interconnects cover a part of the plurality of second source interconnects and a part of the plurality of second drain interconnects.

7. The semiconductor device according to claim 1, further comprising
an insulating film that is disposed vertically above the plurality of first source pads and vertically above the plurality of second common interconnects,
wherein the insulating film has a plurality of openings that partially expose the plurality of first source pads and the plurality of second common interconnects.

8. The semiconductor device according to claim 1, further comprising
a mounting circuit substrate,
wherein the mounting circuit substrate includes:
at least one first via hole opening;
a plurality of first metal plane layers for flip-chip mounting that are electrically connected to the plurality of first common interconnects; and
a third common interconnect that is electrically connected to the first metal plane layers via a via hole formed within the at least one first via hole opening.

9. The semiconductor device according to claim 1, further comprising
a mounting circuit substrate,
wherein the mounting circuit substrate includes:
at least one second via hole opening;
a plurality of second metal plane layers for flip-chip mounting that are electrically connected to the plurality of first source pads; and
a fourth common interconnect that is electrically connected to the second metal plane layers via a via hole formed within the at least one second via hole opening.

10. The semiconductor device according to claim 1, further comprising
a mounting circuit substrate,
wherein the mounting circuit substrate includes:
at least one third via hole opening;
a plurality of third metal plane layers for flip-chip mounting that are electrically connected to the plurality of first source pads; and
a fifth common interconnect that is electrically connected to the third metal plane layers via a via hole formed within the at least one third via hole opening.

11. The semiconductor device according to claim 1, wherein the semiconductor layer includes a nitride semiconductor.

12. The semiconductor device according to claim 1, wherein the plurality of second common interconnects and the first common interconnect are disposed in a same layer.

* * * * *